US007016049B2

(12) United States Patent
Kurosawa

(10) Patent No.: US 7,016,049 B2
(45) Date of Patent: Mar. 21, 2006

(54) ALIGNMENT APPARATUS, CONTROL METHOD THEREFOR, EXPOSURE APPARATUS, DEVICE MANUFACTURING METHOD, SEMICONDUCTOR MANUFACTURING FACTORY, AND EXPOSURE APPARATUS MAINTENANCE METHOD

(75) Inventor: Hiroshi Kurosawa, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 360 days.

(21) Appl. No.: 10/460,178

(22) Filed: Jun. 13, 2003

(65) Prior Publication Data

US 2003/0234939 A1   Dec. 25, 2003

(30) Foreign Application Priority Data

Jun. 25, 2002   (JP)   ............................. 2002-185062

(51) Int. Cl.
  *G01B 9/02*   (2006.01)
  *G01B 11/00*  (2006.01)

(52) U.S. Cl. ...................................... 356/508; 355/399

(58) Field of Classification Search ................. 355/53, 355/55, 59, 77; 356/399–401, 508–510; 250/548

See application file for complete search history.

(56) References Cited

U.S. PATENT DOCUMENTS

| 5,112,133 | A | * | 5/1992 | Kurosawa et al. | 356/401 |
| 5,523,841 | A | * | 6/1996 | Nara et al. | 356/500 |
| 5,525,808 | A | * | 6/1996 | Irie et al. | 356/400 |
| 5,661,388 | A | * | 8/1997 | Kurosawa | 318/625 |
| 5,805,866 | A | * | 9/1998 | Magome et al. | 355/53 |
| 6,481,003 | B1 | * | 11/2002 | Maeda | 716/21 |
| 6,891,624 | B1 | * | 5/2005 | Hill | 356/500 |
| 2002/0018207 | A1 | * | 2/2002 | Ina et al. | 356/400 |
| 2002/0026878 | A1 | * | 3/2002 | Kwan et al. | 101/463.1 |
| 2002/0159040 | A1 | * | 10/2002 | Hamatani et al. | 355/52 |
| 2003/0165265 | A1 | * | 9/2003 | Kurosawa | 382/145 |

FOREIGN PATENT DOCUMENTS

| JP | 10-289943 | 10/1998 |
| JP | 11-325832 | 11/1999 |
| JP | 2000-187338 | 7/2000 |
| JP | 2001-23891 | 1/2001 |

* cited by examiner

*Primary Examiner*—Gregory J. Toatley, Jr.
*Assistant Examiner*—Patrick Connolly
(74) *Attorney, Agent, or Firm*—Fitzpatrick, Cella, Harper & Scinto

(57) ABSTRACT

An alignment apparatus including a first position measuring device and a second position measuring device which measure position information of an object to be controlled, a switching device which switches a position measuring system from the first position measuring device to the second position measuring device, depending on a moving area of the object to be controlled, a correction computing device which performs a correction calculation for a measurement result from the first position measuring device using a first correction parameter set to obtain a current position of the object to be controlled, a predicted coordinate computing unit which predicts coordinates of the object to be controlled on the basis of progress of a correction calculation result from the correction computing device, and a reverse correction computing device which performs a calculation for the coordinates predicted by the predicted coordinate computing unit using a second correction parameter set to obtain a command value for the second position measuring device.

6 Claims, 20 Drawing Sheets

FIG. 18

```
URL  http://www.maintain.co.jp/db/input.html

TROUBLE DB INPUT WINDOW

OCCURRENCE DATE OF TROUBLE [2000/3/15] ~4040
MODEL [**********] ~4010
SUBJECT [OPERATION ERROR (START-UP ERROR)] ~4030
DEVICE S/N [465NS4580001] ~4020
DEGREE OF URGENCY [D] ~4050
SYMPTOM  [LED KEEPS FLICKERING
          AFTER POWER ON          ] ~4060

REMEDY   [POWER ON AGAIN
          (PRESS RED BUTTON IN ACTIVATION)] ~4070

PROGRESS [INTERIM HAS BEEN DONE   ] ~4080

[SEND] [RESET]      4100              4110              4120
LINK TO RESULT LIST DATABASE    SOFTWARE LIBRARY    OPERATION GUIDE
```

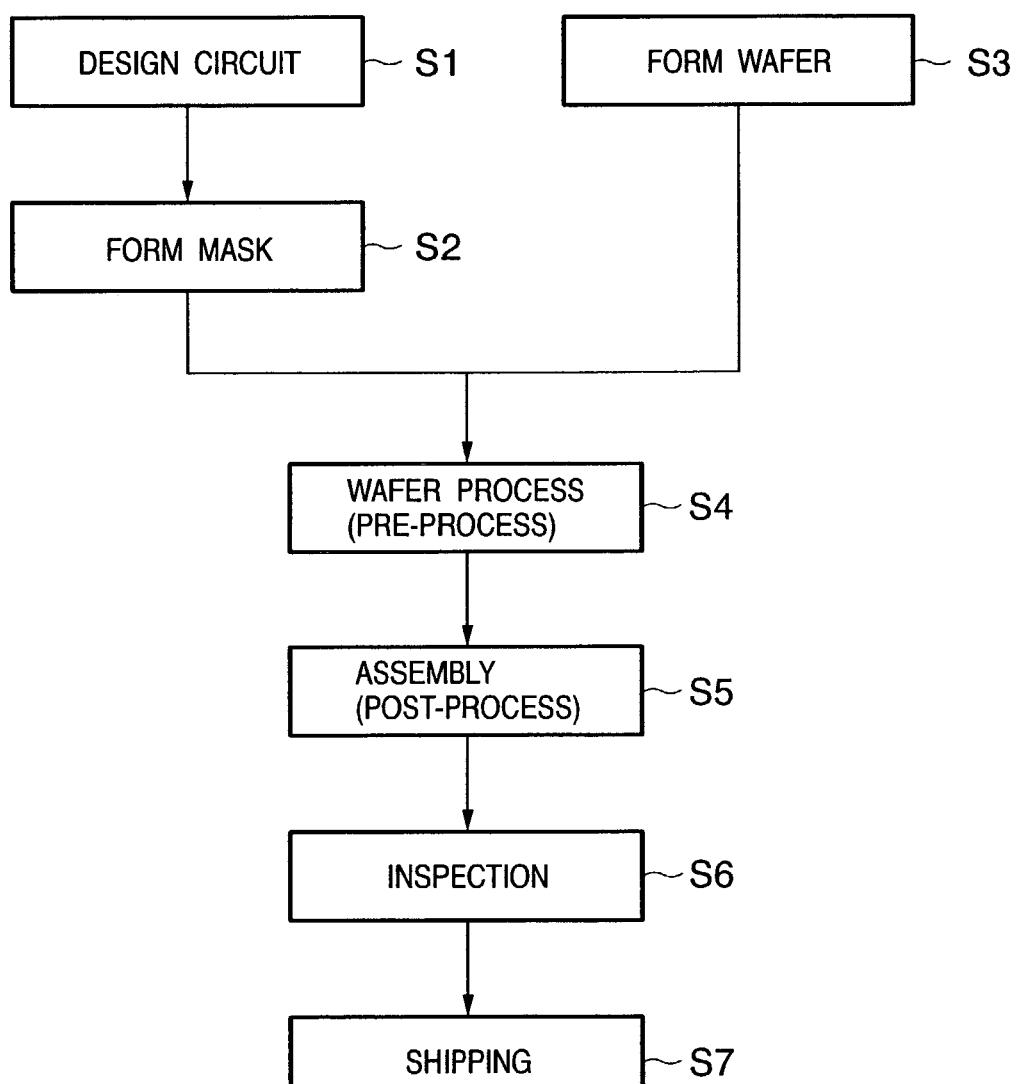

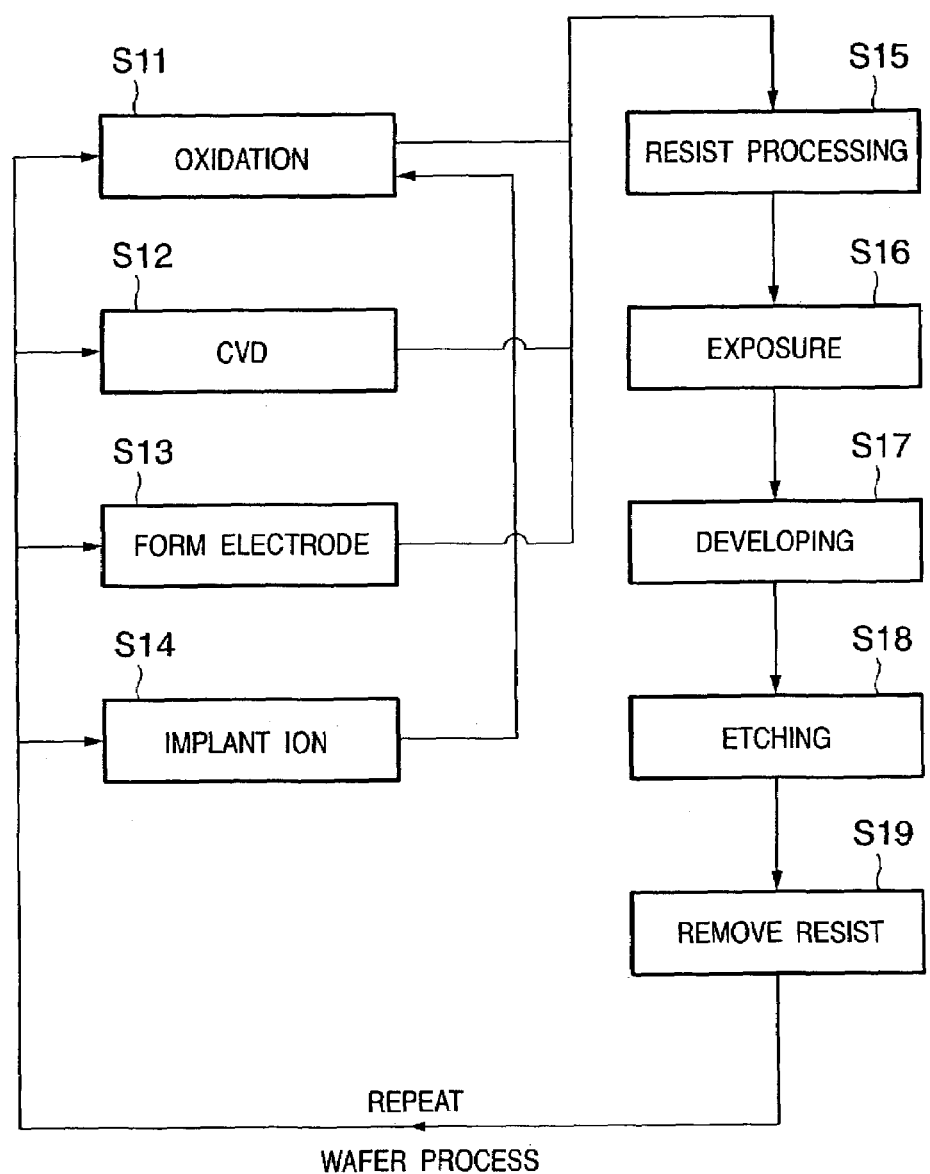
F I G. 20

ALIGNMENT APPARATUS, CONTROL METHOD THEREFOR, EXPOSURE APPARATUS, DEVICE MANUFACTURING METHOD, SEMICONDUCTOR MANUFACTURING FACTORY, AND EXPOSURE APPARATUS MAINTENANCE METHOD

FIELD OF THE INVENTION

The present invention relates to an alignment apparatus, a control method therefor, an exposure apparatus, a device manufacturing method, a semiconductor manufacturing factory, and an exposure apparatus maintenance method.

BACKGROUND OF THE INVENTION

In a stage control system using a laser interferometer, an interferometer which measures the position of a stage generally has one measurement axis per one degree of freedom of a driving shaft, as disclosed in, e.g., Japanese Patent Laid-Open No. 10-289943. However, to increase the driving stroke of the stage in this control system, a reflection mirror which reflects measurement light from the interferometer needs to have a length corresponding to that of the driving stroke. Consequently, the mass of the mirror to be mounted on the stage increases to decrease the natural frequency, and an increase in dynamic characteristics of the stage cannot be expected.

Japanese Patent Laid-Open No. 2001-23891 discloses an example wherein a plurality of laser interferometers are provided for one-axis position measurement to measure the position of a stage. Since the measurement optical axes of the plurality of interferometers strike a reflection mirror in this arrangement, the reflection mirror need not have a size corresponding to that of the movable stroke of the stage. The switching positions of the plurality of interferometers have a hysteresis with respect to the traveling direction, thereby avoiding chattering in switching operation in the vicinity of each interferometer switching position.

In Japanese Patent Laid-Open No. 2000-187338 as well, a plurality of laser interferometers are provided for one axis of the stage driving stroke of an exposure apparatus. Switching is performed between the interferometers in off-axis alignment measurement and in exposure, thereby reducing the weight of a reflection mirror for the interferometers.

To measure the position of the stage of an object to be measured (e.g., an exposure apparatus) by switching between two interferometers, generally, a stroke is set within which the two interferometers can simultaneously measure the position of the stage, and the measurement value of one interferometer as the switching source is preset to the measurement value of the other interferometer measuring the current position of the stage when the measurement positions of the two interferometers fall within the stroke. The same applies to a case wherein interferometer switching is performed twice or more. Assume that the measurement axis in use is switched from the measurement axis of one interferometer to that of another while a stage to be controlled is moving. In this case, an error of a certain magnitude proportional to the moving velocity occurs unless a period of time from when the measurement value of one interferometer is read to when the measurement value of another interferometer is preset to the read measurement value is 0. Variations in periods of time required for the presetting cause an error to have an indefinite magnitude, and the error magnitude of the current position held by each interferometer accumulates. Under the circumstances, to avoid these problems, various remedies are adopted. For example, the number of times of interferometer switching in processing a wafer by an exposure apparatus is reduced or interferometer switching is performed while a wafer stage is stopped during baseline measurement.

However, in the above-mentioned remedies, an interferometer switching position needs to be arranged at a specific position such as a baseline measurement position limited by the system. This imposes constraints on system design. For this reason, a control system capable of performing switching between interferometer measurement axes at arbitrary positions has been desired.

In a control system which has a position measuring device including, e.g., an interferometer, mode separation is performed to generate command position coordinates on the basis of the current position of the stage or an interferometer measurement value in order to set a stage target value (to be referred to as a target value in an abstract coordinate system hereinafter), which is used in the higher sequence to the value of a prototype serving as a reference of a scale and perpendicularity or to eliminate interference from other axes. A conversion calculation between an interferometer measurement value (RAW data of each laser interferometer counter in FIGS. 5 and 12) and a value in an abstract coordinate system will be referred to as "fine correction" hereinafter. A correction parameter set is provided for each stage driving axis and is used to adjust for each device a deviation from a true value, which is generated due to the assembly tolerance and processing error of the control system, by self-measurement or external measurement.

To eliminate any steady-state deviation in scan driving at a uniform velocity, a wafer stage used for a scan exposure apparatus tends to be adjusted such that high feedback gain is obtained in a low-frequency region. Assume that a deviation from the target value of the wafer stage changes stepwise in the control system like this. In this case, even if the amount of deviation is as small as about several $\mu$m, a current command value issued from the stage to a motor may saturate. As a result, various troubles may be induced. More specifically, the control system may become unstable or the protective circuit of the motor may operate. Assume that at the instant when the laser interferometer in charge of measuring the current position of the wafer stage is switched from one laser interferometer to another, an interferometer measurement value to be handed over is discontinuous or a current interferometer has a different correction parameter set for correcting an interferometer measurement value from that of a succeeding interferometer. In this case, even if the target position issued from the higher sequence to the wafer stage is constant, a deviation amount from the target value may change stepwise. This variation in position information will be described below by taking magnification correction of an interferometer measurement value as an example. Since the magnification of an interferometer has a high absolute precision, there is generally not much need for correction for each interferometer. For the sake of descriptive simplicity, magnification correction will be described as the simplest example.

Let L1 be a measurement value of a current interferometer 1, X1 be the current position of a stage, L2 be a measurement value of a succeeding interferometer 2, X2 be the current position of the stage, ML1 be a magnification correction amount from the reference scale of the interferometer 1, ML2 be a magnification correction amount from the reference scale of the interferometer 2, and X0 be an origin offset amount in the X-axis direction. When switching from the interferometer 1 to the interferometer 2 is to be performed, the measurement value of the interferometer 2 is preset to the measurement value of the interferometer 1 while the stage is stopped. In this case, a variation (ΔX) in current position in an abstract coordinate system is represented by:

$$X1 = L1 \times (ML1+b) + X0 \quad (1)$$

$$X2 = L2 \times (ML2+b) + X0 \quad (2)$$

Since L2 is preset to L1, L1=L2 holds.

$$\Delta X = X2 - X1 = L1(ML2 - ML1) \quad (3)$$

The variation ΔX represented by equation (3) changes depending on the position of the stage. For this reason, current saturation may occur at some interferometer switching positions with respect to interferometer measurement values.

As can be seen from the above description, in a stage having a plurality of interferometers per axis, the interferometers need to be precisely arranged such that each interferometer has the same measurement conditions for the exit angle and dead path length (optical length as the position measurement target) of measurement light of the interferometer illuminating an interferometer reflection mirror of the stage. However, it is difficult to precisely arrange these interferometers so as to attain the required precision.

SUMMARY OF THE INVENTION

The present invention has been made in consideration of the above-mentioned problems, and has as its object to perform high-precision position measurement by switching between, e.g., a plurality of position measuring devices.

According to the first aspect of the present invention, there is provided an alignment apparatus which drives an object to be controlled to a predetermined target position, comprising a first position measuring device and a second position measuring device which measure position information of an object to be controlled, a switching device which switches a position measuring device from the first position measuring device to the second position measuring device, depending on a moving area of the object to be controlled, a correction computing device which performs correction calculation for a measurement result from the first position measuring device using a first correction parameter set to obtain a current position of the object to be controlled, a position controller which generates a signal for driving the object to be controlled to a target position on the basis of a correction calculation result from the correction computing device, and a reverse correction computing device which performs calculation for the signal generated by the position controller using a second correction parameter set to obtain a command value for the second position measuring device.

According to a preferred embodiment of the present invention, the first and second measuring devices measure position information, in a predetermined direction, of the object to be controlled.

According to a preferred embodiment of the present invention, the first and second measuring devices simultaneously measure the position information of the object to be controlled.

According to a preferred embodiment of the present invention, each of the first and second correction parameters includes a coefficient of a polynomial formed by combining position coordinates of the object to be controlled as variables.

According to a preferred embodiment of the present invention, each of the first and second correction parameters includes a correction table.

According to a preferred embodiment of the present invention, the apparatus further comprises a setting device which presets a measurement value of the second position measuring device as a switching destination on the basis of the command value calculated by the reverse correction computing device.

According to a preferred embodiment of the present invention, the setting device presets the measurement value when the switching device switches the position measuring device from the first position measuring device to the second position measuring device.

According to a preferred embodiment of the present invention, the apparatus further comprises a first difference computing device which obtains a difference between a measurement result from the first measuring device and a measurement result from the second measuring device.

According to a preferred embodiment of the present invention, the setting device presets as the measurement value of the second position measuring device a value obtained by adding the difference to the command value calculated by the reverse correction computing device.

According to a preferred embodiment of the present invention, the correction computing device performs correction calculation for the measurement results from the first and second position measuring devices using the first and second correction parameters, respectively, and the first difference computing device obtains a difference between correction calculation results obtained by the correction computing device.

According to a preferred embodiment of the present invention, the setting device presets as the measurement value of the second position measuring device a resultant value obtained by adding the difference calculated by the first difference computing device to the signal generated by the position controller.

According to a preferred embodiment of the present invention, the position controller comprises a profiler which generates a control target value for driving the object to be controlled up to the target position and a second difference computing device which obtains a deviation amount of the current position of the object to be controlled calculated by the correction computing device from the control target value generated by the profiler, and generates a signal for driving the object to be controlled to the target position on the basis of the deviation amount.

According to the second aspect of the present invention, there is provided an alignment apparatus which drives an object to be controlled to a predetermined target position, comprising a first position measuring device and a second position measuring device which measure position information of an object to be controlled, a switching device which switches from the first position measuring device to the second position measuring device, depending on a moving area of the object to be controlled, a correction computing device which performs correction calculation for a measurement result from the first position measuring device using a first correction parameter set to obtain a current position of the object to be controlled, a predicted coordinate computing unit which predicts coordinates of the object to be controlled on the basis of progress of a correction calculation result from the correction computing device, and a reverse correction computing device which performs calculation for the coordinates predicted by the predicted coordinate computing unit using a second correction parameter set to obtain a command value for the second position measuring device.

According to a preferred embodiment of the present invention, the predicted coordinate computing unit includes a velocity computing unit which calculates a velocity of the object to be controlled on the basis of the progress of the correction calculation result from the correction computing device.

According to a preferred embodiment of the present invention, the predicted coordinate computing unit includes a multiplier which multiplies the velocity of the object to be controlled by a sampling clock time.

According to a preferred embodiment of the present invention, the predicted coordinate computing unit includes an adder which adds the current position of the object to be controlled calculated by the correction computing device to a product from the multiplier.

According to a preferred embodiment of the present invention, the first and second position measuring devices measure position information, in a three-dimensional direction, of the object to be controlled, which can move in the three-dimensional direction.

According to the third aspect of the present invention, there is provided an exposure apparatus comprising an optical system which projects, to a substrate, exposure light incident on a master bearing a pattern, a stage apparatus which holds and aligns the substrate or the master, and an alignment apparatus which controls alignment of the stage apparatus, wherein the alignment apparatus has a first position measuring device and a second position measuring device which measure position information of an object to be controlled, a switching device which switches a position measuring device from the first position measuring device to the second position measuring device, depending on a moving area of the object to be controlled, a correction computing device which performs correction calculation for a measurement result from the first position measuring device using a first correction parameter set to obtain a current position of the object to be controlled, a position controller which generates a signal for driving the object to be controlled to a target position on the basis of a correction calculation result from the correction computing device, and a reverse correction computing device which performs calculation for the signal generated by the position controller using a second correction parameter set to obtain a command value for the second position measuring device.

According to the fourth aspect of the present invention, there is provided a device manufacturing method comprising a step of installing a plurality of semiconductor manufacturing apparatuses, including an exposure apparatus, in a factory, and a step of manufacturing a semiconductor device by using the plurality of semiconductor manufacturing apparatuses, wherein the exposure apparatus has an optical system which projects, to a substrate, exposure light incident on a master bearing a pattern, a stage apparatus which holds and aligns the substrate or the master, and an alignment apparatus which controls alignment of the stage apparatus, and the alignment apparatus has a first position measuring device and a second position measuring device which measure position information of an object to be controlled, a switching device which switches a position measuring system from the first position measuring device to the second position measuring device, depending on a moving area of the object to be controlled, a correction computing device which performs a correction calculation for a measurement result from the first position measuring device using a first correction parameter set to obtain a current position of the object to be controlled, a position controller which generates a signal for driving the object to be controlled to a target position on the basis of a correction calculation result from the correction computing device, and a reverse correction computing device which performs calculation for the signal generated by the position controller using a second correction parameter set to obtain a command value for the second positioning measuring device.

According to a preferred embodiment of the present invention, the method further comprises a step of connecting the plurality of semiconductor manufacturing apparatuses via a local area network, a step of connecting the local area network to an external network outside the factory, a step of acquiring information about the exposure apparatus from a database on the external network by using the local area network and the external network, and a step of controlling the exposure apparatus on the basis of the acquired information.

According to the fifth aspect of the present invention, there is provided a semiconductor manufacturing factory comprising a plurality of semiconductor manufacturing apparatuses including an exposure apparatus, a local area network which connects the plurality of semiconductor manufacturing apparatuses, and a gateway which connects the local area network to an external network outside the semiconductor manufacturing factory, wherein the exposure apparatus has an optical system which projects, to a substrate, exposure light incident on a master bearing a pattern, a stage apparatus which holds and aligns the substrate or the master, and an alignment apparatus which controls alignment of the stage apparatus, and the alignment apparatus has a first position measuring device and a second position measuring device which measure position information of an object to be controlled, a switching device which switches a position measuring device from the first position measuring device to the second position measuring device, depending on a moving area of the object to be controlled, a correction computing device which performs correction calculation for a measurement result from the first position measuring device using a first correction parameter set to obtain a current position of the object to be controlled, a position controller which generates a signal for driving the object to be controlled to a target position on the basis of a correction calculation result from the correction computing device, and a reverse correction computing device which performs calculation for the signal generated by the position controller using a second correction parameter set to obtain a command value for the second position measuring device.

According to the sixth aspect of the present invention, there is provided an exposure apparatus maintenance method comprising a step of preparing a database for accumulating information about maintenance of an exposure apparatus on an external network outside a factory where the exposure apparatus is installed, a step of connecting the exposure apparatus to a local area network in the factory, and a step of maintaining the exposure apparatus on the basis of the information accumulated in the database by using the external network and the local area network, wherein the exposure apparatus has an optical system which projects, to a substrate, exposure light incident on a master bearing a pattern, a stage apparatus which holds and aligns the substrate or the master, and an alignment apparatus which controls alignment of the stage apparatus, and the alignment apparatus has a first position measuring device and a second position measuring device which measure position information of an object to be controlled, a switching device which switches a position measuring device from the first position measuring device to the second position measuring device, depending on a moving area of the object to be controlled, a correction computing device which performs correction calculation for a measurement result from the first position measuring device using a first correction parameter set to obtain a current position of the object to be controlled, a position controller which generates a signal for driving the object to be controlled to a target position on the basis of a correction calculation result from the correction computing device, and a reverse correction computing device which performs calculation for the signal generated by the position controller using a second correction parameter set to obtain a command value for the second position measuring device.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 18 is a view showing an example of a window when a user interface is provided on a display;

FIG. 19 is a flow chart showing the flow of the whole manufacturing process of a semiconductor device; and FIG. 20 is a flow chart showing the detailed flow of the wafer process.

DESCRIPTION OF THE PREFERRED EMBODIMENTS

[First Embodiment]

Figure 1:
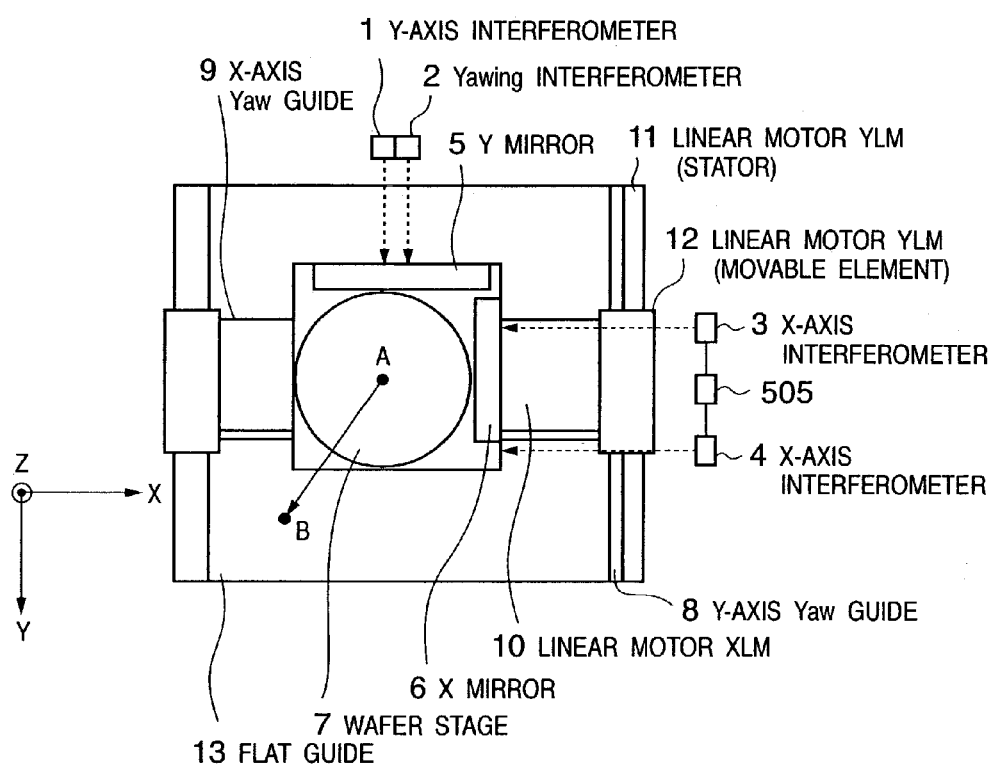
FIG. 1 is a view showing an example of an alignment apparatus according to a preferred embodiment of the present invention.

FIG. 1 is a view showing an example of an alignment apparatus according to a preferred embodiment of the present invention and particularly shows a case wherein the alignment apparatus is applied to the wafer stage of a semiconductor exposure apparatus. A wafer chuck (not shown), an X mirror 6, and a Y mirror 5 are mounted on a wafer stage 7. The X mirror 6 reflects measurement light from an X-axis interferometer 3 or an X-axis interferometer 4 and is used to measure the position coordinate, in the X-axis direction, of the wafer stage 7. The Y mirror 5 reflects measurement light from a Y-axis interferometer 1 and a yawing interferometer 2 and is used to measure the position coordinate, in the Y-axis direction, of the wafer stage 7. A linear motor XLM 10 drives the wafer stage 7 in the X direction and is guided by an X-axis yaw guide 9. A linear motor YLM (stator) 11 drives a linear motor YLM (movable element) 12 in the Y direction and is guided by a Y-axis yaw guide 8. The wafer stage 7 is guided by a flat guide 13. A control unit 505 (to be described later) switches an interferometer to be used in measurement of the coordinate in the X-axis direction between the X-axis interferometers 3 and 4 depending on the Y-coordinate value of the driven wafer stage 7. More specifically, if the wafer stage 7 is located near the Y-axis interferometer 1, the X mirror 6 does not reach the optical axis of the X-axis interferometer 4, and thus the X-axis interferometer 3 measures the X-axis position. On the other hand, if the wafer stage 7 is located far from the Y-axis interferometer 1, the X-axis interferometer 4 measures the X-axis position for the same reason.

The main object of the present invention is to provide a mechanism for performing switching between the measurement values of the measuring systems of laser interferometers when laser interferometers for two or more axes are arranged for one degree of freedom of the wafer stage 7 and continually hands over the current position of the stage in handover of measurement values of the current position to perform measurement at high precision.

Figure 2:
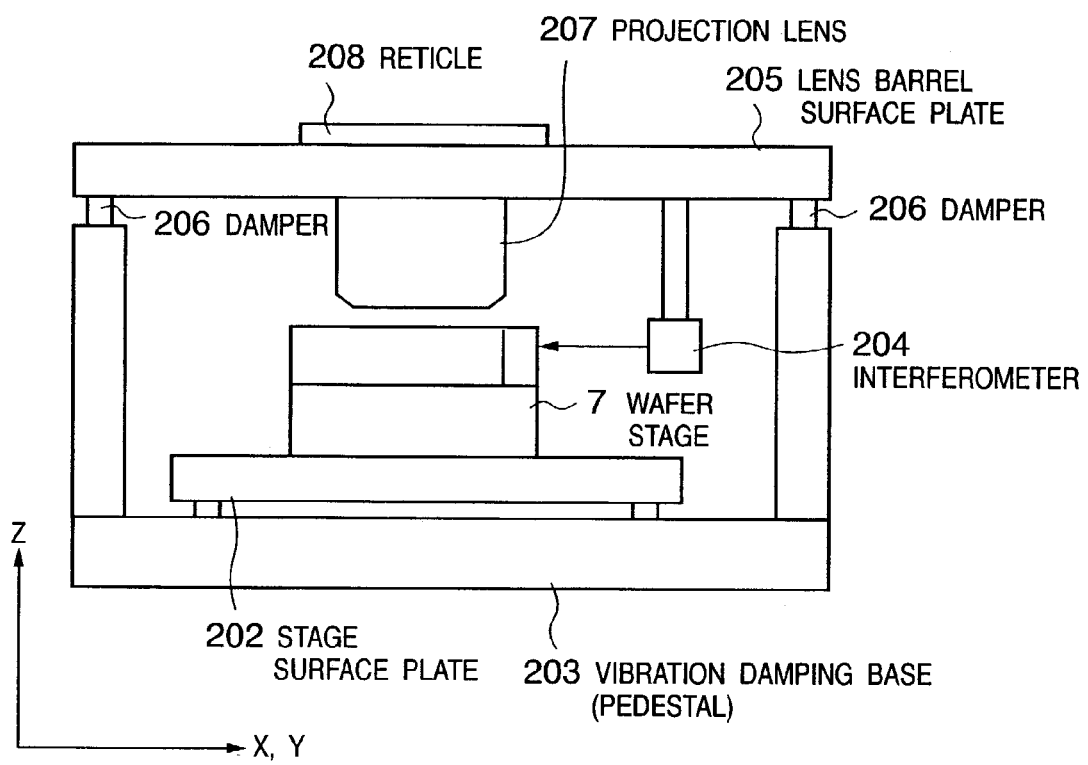
FIG. 2 is a view of the alignment apparatus shown in FIG. 1, as seen from the side.

FIG. 2 is a view of the alignment apparatus of FIG. 1, as seen from the side.

The position of the wafer stage 7 is measured by an interferometer 204, which is fixed to a lens barrel surface plate 205. The interferometer 204 is one of the Y-axis interferometer 1, yawing interferometer 2, X-axis interferometer 3, and X-axis interferometer 4 in FIG. 1, as seen from the side. The lens barrel surface plate 205 is held by a damper 206 to float above a vibration damping base (pedestal) 203. The lens barrel surface plate 205 is designed not to transfer high-frequency vibrations from the floor to the interferometer 204 and an exposure apparatus projection optical system (not shown). A plurality of interferometers 204 are arranged on the lens barrel surface plate 205 depending on the position in the measurement axis direction and that in the Y direction.

A stage surface plate 202 is also designed not to transfer high-frequency vibrations from the floor to the wafer stage 7, like the lens barrel surface plate 205. A projection lens 207 is mounted on the lens barrel surface plate 205 to project a pattern image from a reticle 208 also mounted on the lens barrel surface plate 205 onto a wafer (not shown) loaded on the wafer stage 7.

Figure 3:
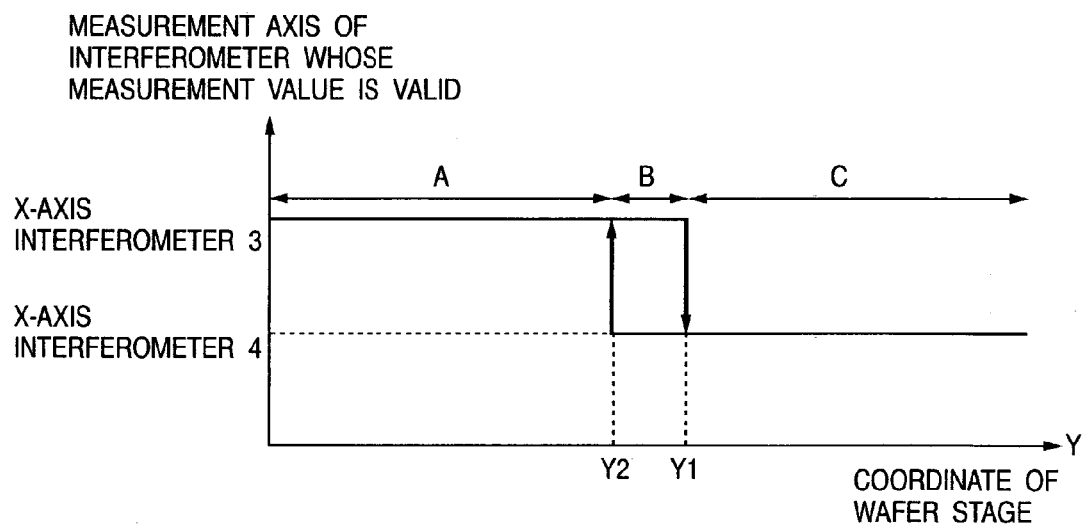
FIG. 3 is a graph showing the relationship between the Y-coordinate of a wafer stage and the measurement axes of interferometers whose measurement values are valid in the alignment apparatus of FIG. 1.

FIG. 3 is a graph showing the relationship between the measurement axes of interferometers whose measurement values are valid and the Y-coordinate of the wafer stage 7 in the alignment apparatus of FIG. 1. If the wafer stage 7 is located near the Y-axis interferometer 1 in FIG. 1, the measurement optical axis of the X-axis interferometer 4 does not strike the X mirror 6, and only the X-axis interferometer 3 measures the current position of the wafer stage 7 (zone A).

If the wafer stage 7 moves to near the center of the driving stroke, measurement light beams of both the X-axis interferometers 3 and 4 strike the X mirror 6. Accordingly, both the X-axis interferometers 3 and 4 can perform position measurement (zone B). If X-axis interferometer 4 hands over a measurement value from the X-axis interferometer 3, the current position information to be counted by the X-axis interferometer 4 has a value accumulating from an indefinite value and thus does not precisely represent the current position of the wafer stage 7. For this reason, when the wafer stage 7 moves from the zone A to the zone B, a measurement value is handed over from the X-axis interferometer 3 to the X-axis interferometer 4. More specifically, the current position information held by the X-axis interferometer 3 is preset to that of the X-axis interferometer 4, and the X-axis interferometer 4 continues to count a relative movement amount of the wafer stage 7 immediately after the handover. This can obtain correct position measurement values all over the Y stroke of the wafer stage 7 using the X-axis interferometers 3 and 4. As a position at which a measurement value of the current position is handed over from the X-axis interferometer 3 to the X-axis interferometer 4, coordinates at which measurement beams of both the succeeding interferometer and the current interferometer simultaneously strike the X mirror 6 must be selected. This also applies to a case wherein a measurement value of the current position is handed over from the X-axis interferometer 4 to the X-axis interferometer 3.

If the wafer stage 7 is located far from the Y-axis interferometer 1 of FIG. 1, the measurement optical axis of the X-axis interferometer 3 does not strike the X mirror 6, and only the X-axis interferometer 4 measures the current position of the wafer stage 7 (zone C). When the wafer stage 7 moves back from the zone C to the zone B, a measurement value of the current position is handed over from the X-axis interferometer 4 to the X-axis interferometer 3 in the same way.

Reference numerals Y1 and Y2 denote a switching position (Y1) where a measurement value is handed over from the X-axis interferometer 3 to the X-axis interferometer 4 and a switching position (Y2) where a measurement value is handed over from the X-axis interferometer 4 to the X-axis interferometer 3, respectively. Switching positions Y1 and Y2 are preferably set at different positions. This can avoid chattering (undesirable frequent switching of an interferometer to hold a measurement value), which may occur when the target position of the wafer stage 7 is set to a position in the vicinity of a switching position. If the alignment apparatus according to the preferred embodiment of the present invention is to be used for a scanning exposure apparatus, the switching positions Y1 and Y2 may be changed in accordance with the step size in the X direction such that interferometer switching is not performed during scanning exposure in the Y-axis direction. After the presetting, a measurement value, which is to be serve as the base data of abstract coordinates used in the higher sequence, may be obtained from either interferometer 3 or 4, as long as it is obtained while measurement light from the interferometer strikes the X mirror 6. More specifically, it is not always necessary to use a measurement value of the interferometer as the switching destination after the presetting of the interferometer. While the interferometer as the switching source is able to measure the current position of the wafer stage 7, a measurement value from either interferometer may be used. When a measurement value is to be converted into a form suitable for an abstract coordinate system, a correction parameter set corresponding to the interferometer, from which the measurement value originates, needs to be used in a fine correction calculation according to the present invention.

Figure 4:
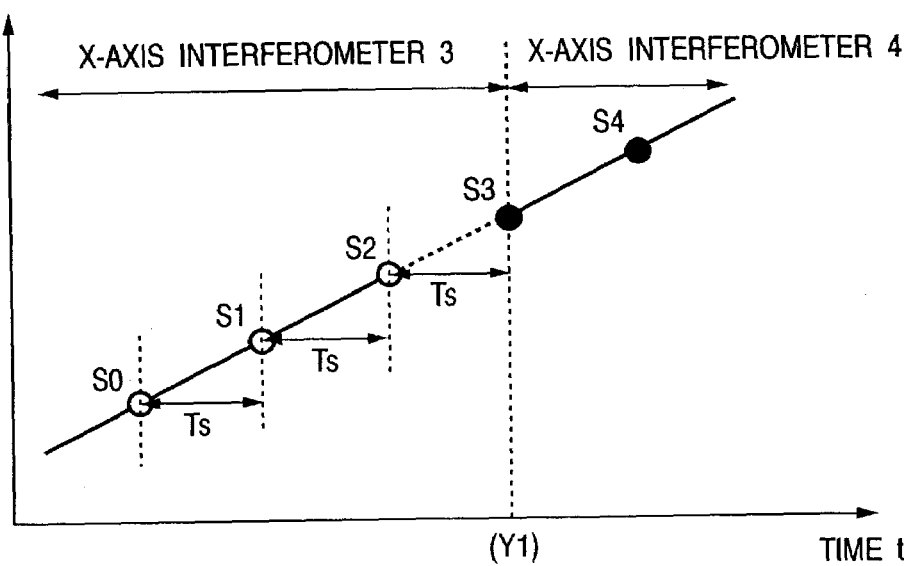
FIG. 4 is a graph showing the processing in sample clocks of the interferometer switching sequence of the alignment apparatus of FIG. 1.

FIG. 4 is a graph showing the processing in sample clocks of the interferometer switching sequence in the alignment apparatus shown in FIG. 1. Stage coordinate measurement values S0 to S4 represent stage coordinate measurement values obtained for every interferometer sampling time while the center of the wafer stage 7 moves from the point A to the point B shown in FIG. 1. The wafer stage 7 is driven at a uniform velocity, and its target position is set such that the wafer stage 7 moves across the switching point Y1 shown in FIG. 3 at the uniform velocity. The wafer stage 7, having been moving toward Y1 at the uniform velocity at the stage coordinates S0 and S1, approaches the switching position Y1 at the stage coordinate S2. The next stage coordinate S3 is obtained by S2−S1, or a stage moving velocity (Vs) which is calculated using previous sampled data of the stage coordinate and a sampling time interval (Ts), as given by:

$$S3 = S2 + (S2 - S1) \quad (4)$$

or $$S3 = S2 + Vs \times Ts \quad (5)$$

After a measurement value at S2 is obtained, the X-axis interferometer 4 is preset to have the value of S3 obtained by equation (4) or equation (5) at the next sampling timing. With this operation, the current position of the wafer stage 7 measured by the interferometer 3 is handed over to the interferometer 4. In this embodiment, when handover of the stage current position is to be performed through laser interferometer counters, the logical driving target value (X-axis direction component) of the wafer stage 7, at which interferometer switching is performed, is valid even if it does not change. More specifically, it is difficult to adjust the respective positions the X mirror 6 and the Y mirror 5 of the wafer stage 7 so as to form a complete right angle. For this reason, even if the logical target value having undergone orthogonality correction does not change, a measurement value indicated by a laser interferometer counter may change depending on the driving position of the orthogonal axes. For this reason, the stage moving velocity Vs in the interferometer switching target axis slightly exceeds the logical velocity. Accordingly, when the stepping velocity of the wafer stage 7 increases or the desired alignment precision in the exposure apparatus increases, the excess of the velocity may become non-negligible.

Figure 5:
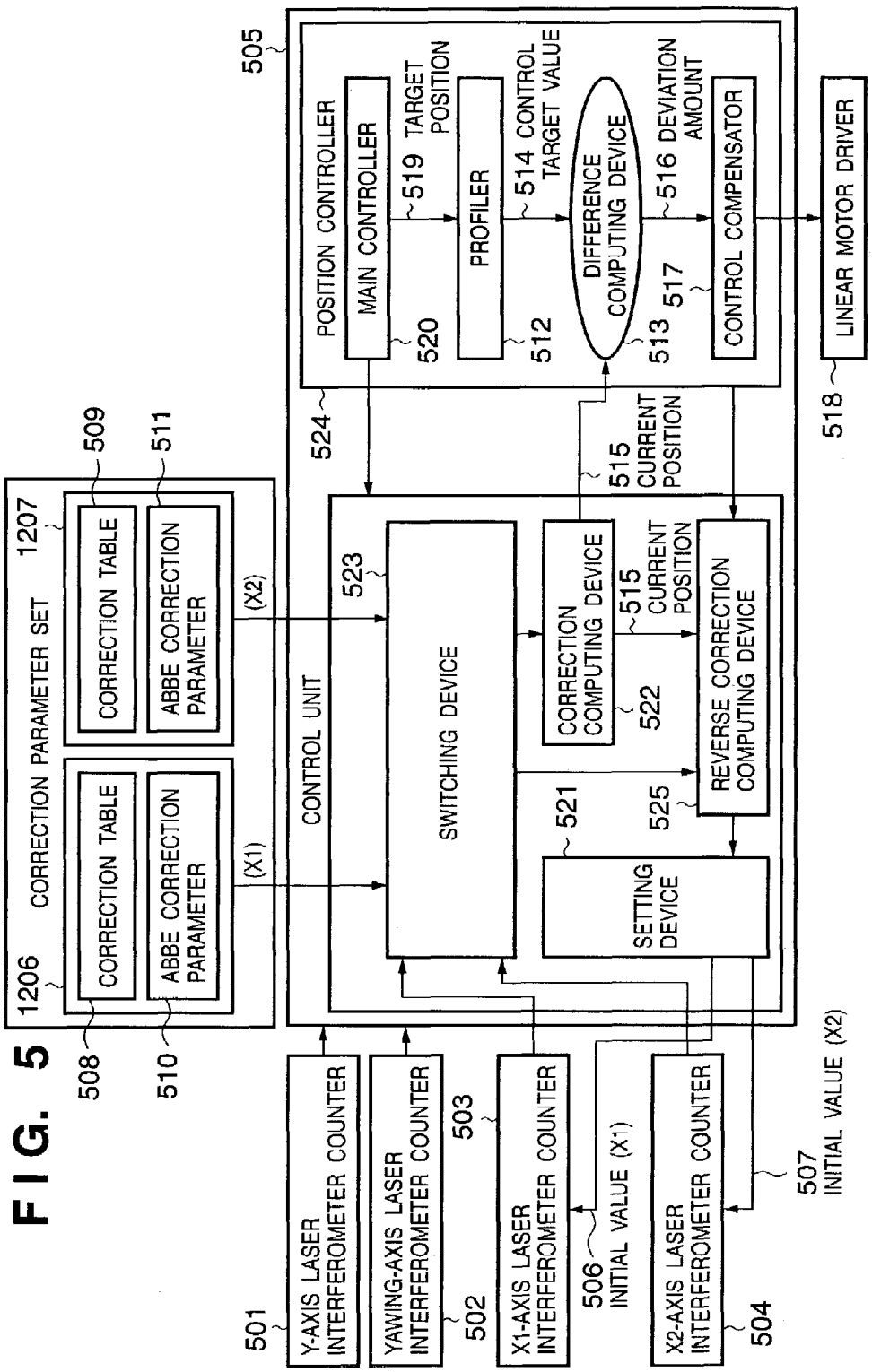
FIG. 5 is a diagram showing the arrangement of a control unit of the alignment apparatus of FIG. 1.

It is also possible to predict the stage moving velocity Vs on the basis of a profiler 512 shown in FIG. 5 used to drive the wafer stage 7. In this case, Vs(t), wherein t is a time when the wafer stage 7 moves across an interferometer switching point, may be calculated in advance, thereby calculating the preset position of S3. With this operation, interferometer axis switching can be performed even in a zone within which the wafer stage 7 accelerates/decelerates.

Figure 7:
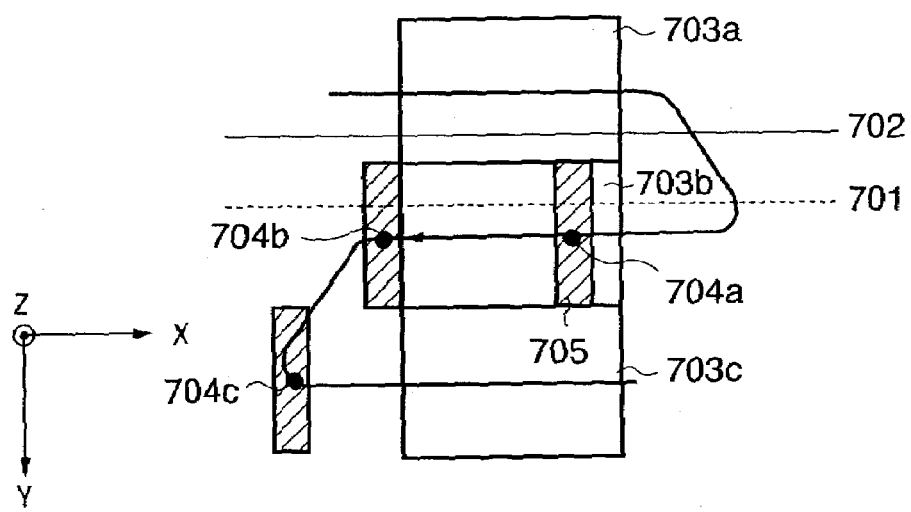
FIG. 7 is a view showing the stage driving locus in a scanning exposure apparatus according to the preferred embodiment of the present invention and the switching positions of interferometers.

FIG. 7 is a view showing the stage driving locus in a scanning exposure apparatus according to the preferred embodiment of the present invention and the switching positions of interferometers;

Reference numerals 703a to 703c show the layout of exposure shots arranged on the wafer. A reticle pattern is transferred onto the wafer, and the wafer is exposed to the pattern through an exposure slit 705. The exposure slit 705 proceeds in parallel with a scan axis (X) during exposure of an exposure shot (704a). When the exposure slit 705 passes through the exposure shot (704b), it is immediately stepped in the Y direction to reach the exposure start position of the next shot (704c). At this time, assume that the Y-coordinate at which interferometer switching is performed is located at a coordinate of a dotted line 701 in FIG. 7. Since interferometer switching is performed during acceleration in the Y-axis direction, if the preset position of an interferometer as the switching target is calculated using equation (1) or (2), the magnitude of an error increases.

For this reason, in this case, the Y-coordinate at which interferometer switching is performed is changed to a coordinate indicated by a solid line 702. With this operation, interferometer switching can be performed when an X stage is driven at a uniform velocity. To obtain the same effect, a method of changing the maximum velocity so as to cause the wafer stage 7 to move at a uniform velocity at an interferometer switching position or changing the processing order of exposure shots to increase a Y-step distance may be employed. Alternatively, the wafer stage 7 may be stepped to switch between interferometers and then stepped again to the original target position such that a switching point is located in a zone within which the wafer stage 7 moves at a uniform velocity. These methods, however, may decrease the flexibility of the exposure processing sequence and the throughput. For this reason, these methods are preferably utilized as countermeasures against a case wherein a distance corresponding to the moving distance of an interferometer switching point cannot be secured in a zone within which at least two Y-axis interferometers are available (the zone B in FIG. 3).

Figure 8:
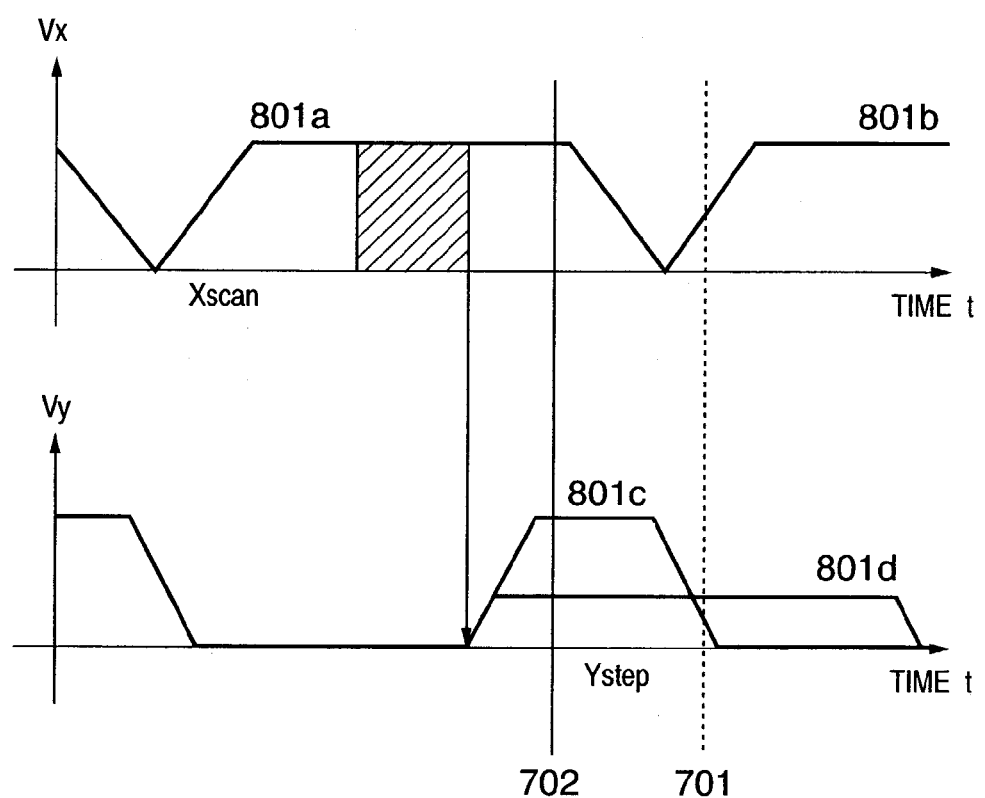
FIG. 8 shows timing charts of the stage driving velocity in the scanning exposure apparatus according to the preferred embodiment of the present invention.

FIG. 8 shows timing charts of the stage driving velocity in the scanning exposure apparatus according to the preferred embodiment of the present invention. Reference numerals 801a and 801b denote X-axis driving profiles when the exposure shots 703a and 703b shown in FIG. 7 are exposed, and 801c, a Y-axis driving profile when the wafer stage 7 is Y-stepped from the exposure shot 703a to the exposure shot 703b. Since the interferometer switching point 701 is located in an acceleration phase in the X-axis driving profile, the switching point is shifted to the interferometer switching point 702 located in a uniform-velocity phase.

At this time, the X-axis driving profile 801b may be delayed and started as X-stepping after Y-stepping ends, instead of shifting the interferometer switching point 701. Alternatively, the maximum velocity of Y-stepping in interferometer switching may be decreased to prolong a period of time for movement at a uniform velocity along X- and Y-axes, as indicated by 801d. More specifically, upon completion of processing of the hatched portion of 801a, which represents a scanning exposure zone, stepping along the Y-axis is started for the next exposure operation. By decreasing the maximum velocity in the Y-axis direction to shorten the time required for acceleration, a longer period of time for the transition to movement at a uniform velocity along the Y-axis before the start of deceleration along the X-axis as the scan axis can be secured. The same effect can be obtained by prolonging the settling time (a uniform-velocity zone other than the hatched area of 801a) during which X-axis scan is performed if interferometer switching occurs.

FIG. 5 is a diagram showing the arrangement of the control unit 505 of the alignment apparatus of FIG. 1. A Y-axis laser interferometer counter 501, yawing-axis laser interferometer counter 502, X1-axis laser interferometer counter 503, and X2-axis laser interferometer counter 504 separately count the RAW data of the measurement values of the respective interferometers. A correction computing device 522 performs correction calculation for these RAW data by fine correction using a correction parameter set (a correction table, the coefficients of ABBE correction parameters, and the like) to obtain a current position 515.

For example, in fine correction, a tilt component is fixed, and shape correction of a bar mirror is omitted. Thus, the current position 515 (the current position in an abstract coordinate system) can be obtained by equation (6) to (8) below. In this embodiment, θ measurement is performed by the Y-axis interferometer. For this reason, theoretically, interferometer switching does not cause the correction amounts of Cy and Dy to change (that is, a correction parameter set which is normally provided for each measurement axis is not always necessary for the θ axis, as in a conventional example). However, when θ axis measurement is to be performed by the X-axis interferometers, the correction amounts are greatly affected by the incident angle of measurement light of the X-axis measurement interferometers and Yaw-axis measurement interferometer on a reflection mirror. For this reason, it is very effective to provide a correction parameter set for each interferometer measurement axis.

$$X = (X\text{raw} - Ortho\_X \times Y) \times Mag\_X \quad (6)$$

$$Y = (Y\text{raw} - Ortho\_Y \times X) \times Mag\_Y \quad (7)$$

$$\theta = (Y\text{raw} - Yaw\text{raw})/Lx - Cy \times (X + Dy \times \theta) \quad (8)$$

X, Y, θ: respective current positions in X, Y, and θ direction;

Xraw, Yraw, Yawraw: RAW data of the respective laser interferometers in the X, Y, and θ directions;

Lx: span of the Y interferometers and Yaw interferometer;

Ortho_X, Ortho_Y: minor orthogonality correction coefficients; and

Cy, Dy: correction coefficients for interference components, with the other axes, of a measurement value of a θ interferometer.

If the wafer stage 7 can be driven in six axial directions (X, Y, θ, Z, ωx, and ωy), the number of the correction parameter sets (the coefficients of ABBE correction parameters) increases, and correction equations become complicated.

As for the correction parameter sets, an X1 correction parameter set 1206 and an X2 correction parameter set 1207 are provided for interferometer measurement optical axes X1 and X2, respectively. When correction calculation is to be performed for the measurement result of each interferometer to obtain the current position in an abstract coordinate system, a correction parameter set corresponding to the interferometer is used. These correction parameter sets include correction function coefficients 510 and 511 (the coefficients of ABBE correction parameters), or correction tables 508 and 509, as given by equations (2), (3), and (4) above.

Figure 13:
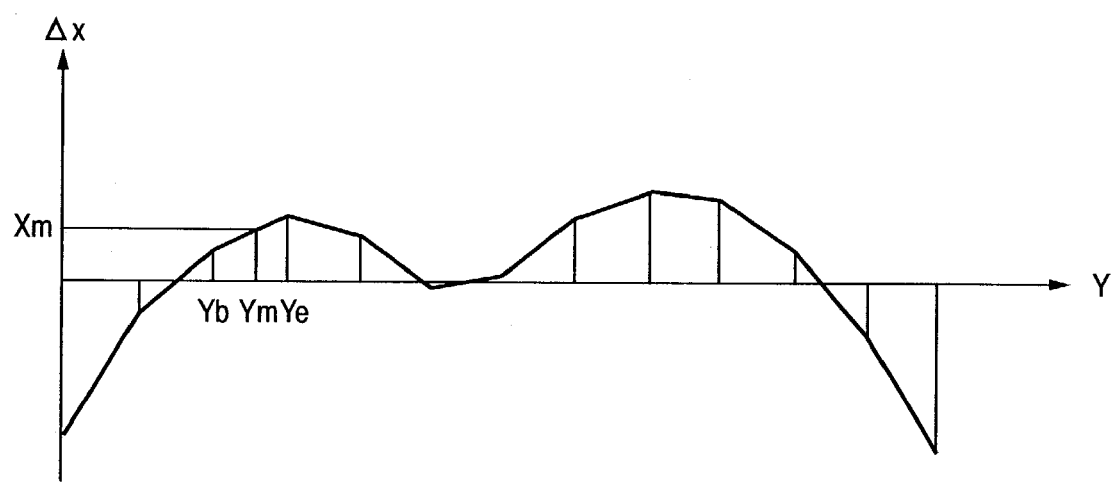
FIG. 13 is a graph plotted by linearly interpolating a correction table for correcting unevenness of the laser reflection plane of the X mirror of the wafer stage in the first embodiment of the present invention.
Figure 14:
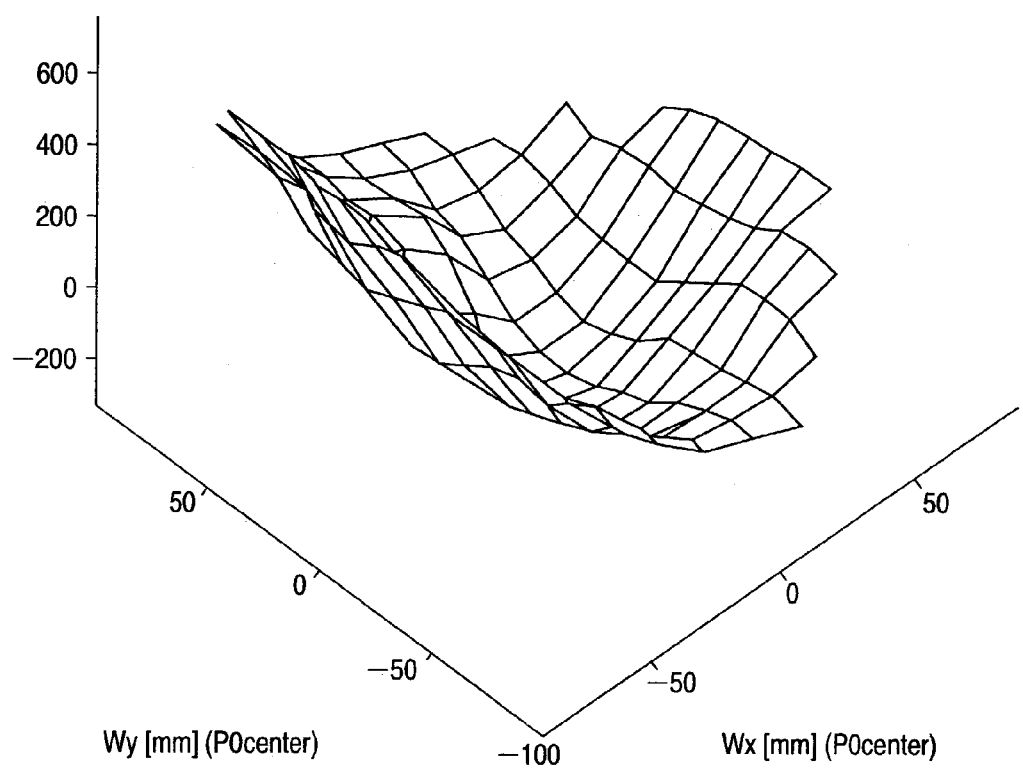
FIG. 14 is a graph showing the correction table of the curved surface of the Z measurement mirror of the wafer stage in the second embodiment of the present invention.

FIGS. 13 and 14 show an example of a case wherein correction parameter sets are provided as the correction tables 508 and 509. FIG. 13 is a graph plotted by linearly interpolating a correction table for correcting unevenness of the laser reflection plane of the X mirror 6 of the wafer stage 7 in the first embodiment of the present invention. To interpolate the correction table, fitting by a higher-order function or spline interpolation may be performed except for linear interpolation to be described in this embodiment. Application of these methods produces the effect of suppressing any disturbance which may occur when calculation using the correction table is applied to stage manipulated variables. Each correction table is defined as the finite number of table data using the Y-coordinate of the wafer stage 7 as an index. For example, assume that reference symbols Yb and Ye shown in FIG. 13 denote sample points supplied by the correction table. In consideration of the positional relationship between the two points Yb and Ye and a point Ym between them, a correction amount Xm of the point Ym is a value obtained by internally dividing the correction amount values of Yb and Ye. By calculating a difference between adjacent data or data which are spaced apart by a finite distance in the same correction table in the same manner, a tilt component (θ) due to deformation of the X mirror 6 as well as the shift component of the X mirror 6 can be obtained.

FIG. 14 is a graph showing the correction table of the curved surface of the Z measurement mirror of the wafer stage 7 in the second embodiment of the present invention (to be described later). A correction table holding method or correction table reproduction method for the correction table of FIG. 14 is the same as that for the correction table of FIG. 13 except that a two-dimensional index is used in FIG. 14, unlike the one-dimensional index in FIG. 13. Additionally, if a difference between adjacent data or data which are spaced apart by a finite distance in the same correction table is calculated, a mirror tilt component (ωx, ωy) can also be obtained.

With only index offsetting, correction tables provided for each interferometer measurement axis can be shared substantially as one correction table. More specifically, in this embodiment, the measurement optical axis of an interferometer as the switching destination measures the same measurement stroke on the surface of the X mirror 6. For this reason, if the index which refers to one of the correction tables is shifted by a difference between the X-axis interferometer 3 and the X-axis interferometer 4 in the Y-axis direction, the correction tables can be shared as one correction table.

Figure 6:
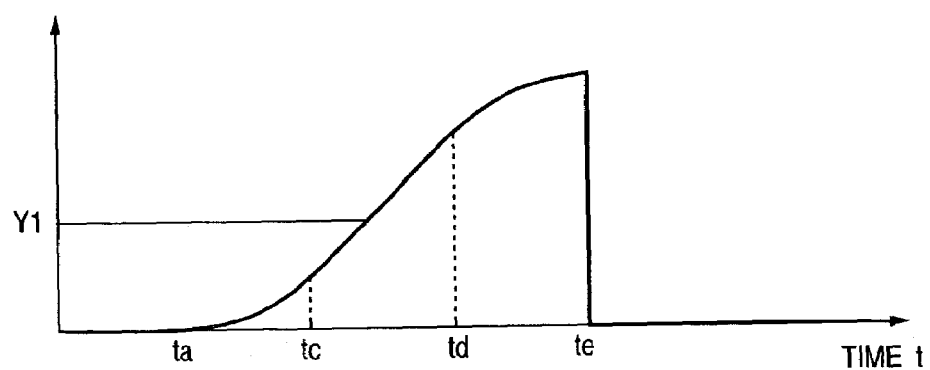
FIG. 6 is a graph showing the step driving waveform of the stage of the alignment apparatus of FIG. 1.

In a position controller 524 shown in FIG. 5, a main controller 520 performs processing such as calculation of a target position 519, designation of interferometer switching positions, and the like. For example, the main controller 520 controls a switching device 523 so as to perform interferometer switching when the stage reaches a predetermined position. Additionally, the main controller 520 sends the target position 519 in an abstract coordinate system to a profiler 512 in order to perform sequential stage alignment. The profiler 512 generates a control target value 514 in an abstract coordinate system which reaches a step target (e.g., a target in Y-stepping) while plotting an S-shaped locus as shown in FIG. 6. In FIG. 6, reference symbol ta denotes an acceleration start point, tc, a point at which driving at a uniform velocity is started after termination of the acceleration, td, a deceleration start point, and te, a stop point after termination of the deceleration. A difference between the control target value 514 generated by the profiler 512 and the current position 515 of the wafer stage 7 is calculated by a difference computing device 513 to obtain a deviation amount 516. The deviation amount 516 obtained by the difference computing device 513 is converted to a manipulated variable of an actuator by a control compensator 517 and sent to a linear motor driver 518. A reverse correction computing device 525 calculates a command value for an interferometer using the correction parameter sets on the basis of the current position 515 obtained by the correction computing device 522 and outputs from the position controller 524. The outputs from the position controller 524 include signals such as the control target value 514, deviation amount 516, and the like. A setting device 521 sends a preset value and/or preset trigger signal to the laser interferometer counter 503 or 504 on the basis of the command value for the interferometer calculated by the reverse correction computing device 525 and presets laser interferometer measurement values.

In this embodiment, fine correction is adopted in the process of converting the measurement result in the laser interferometer counter 503 or 504 into coordinates in an abstract coordinate system. This is because fine correction is advantageous to obtain the actual current position of the stage. To implement this, fine correction calculation must be performed for every control clock of the control compensator 517. The stage current position is not obtained in an abstract coordinate system but in the following manner. More specifically, the stage current position is obtained by building a closed loop control system in a coordinate system showing an interferometer measurement value or a value obtained by adding an offset to the measurement value, performing inverse transform for the coordinate system to obtain a command value, and supplying it to the control system. This method is included in the scope of the present invention, which has a correction parameter set for each interferometer measurement axis.

[Second Embodiment]

Figure 9:
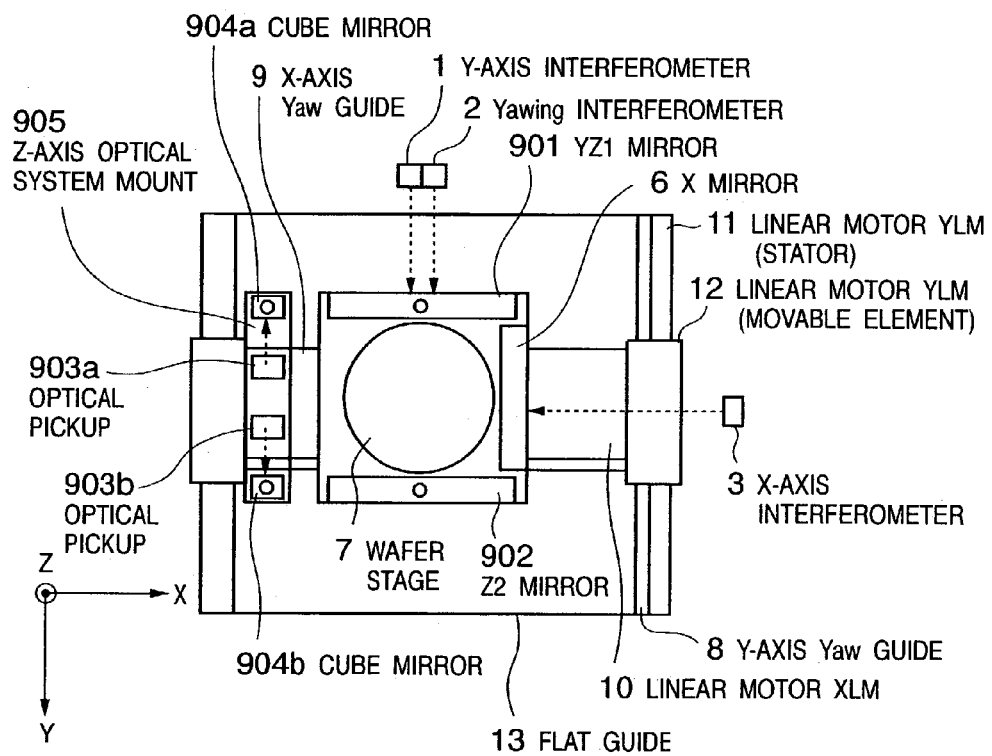
FIG. 9 is a view showing an example of an alignment apparatus according to another preferred embodiment of the present invention.

FIG. 9 is a view showing an example of an alignment apparatus according to another preferred embodiment of the present invention. The same reference numerals denote parts with substantially the same functions as those in the first embodiment. The difference from the first embodiment lies in that a plurality of interferometer axes are arranged with respect to the X-axis in the first embodiment, while a plurality of interferometer axes are arranged with respect to the Z-axis in this embodiment. The Y mirror 5 in FIG. 1 corresponds to a YZ1 mirror 901 in FIG. 9, and the YZ1 mirror 901 is also used as a bar mirror which reflects measurement light of the first Z-axis laser interferometer (not shown) located in the Z-axis direction of FIG. 9. In addition, a Z2 mirror 902 is arranged on the opposite side of the YZ1 mirror 901 to reflect measurement light of the second Z-axis laser interferometer (not shown). Measurement light beams from the Z-axis laser interferometers are introduced to optical pickups 903a and 903b through optical fibers (not shown). The measurement light beams emitted from the optical pickups 903a and 903b are reflected by cube mirrors 904a and 904b in the Z-axis direction. A Z-axis optical system mount 905 is fixed on an XLM 10. When a wafer stage 7 is driven along the Y-axis, the Z-axis optical system mount 905 simultaneously moves in the Y direction.

Figure 10:
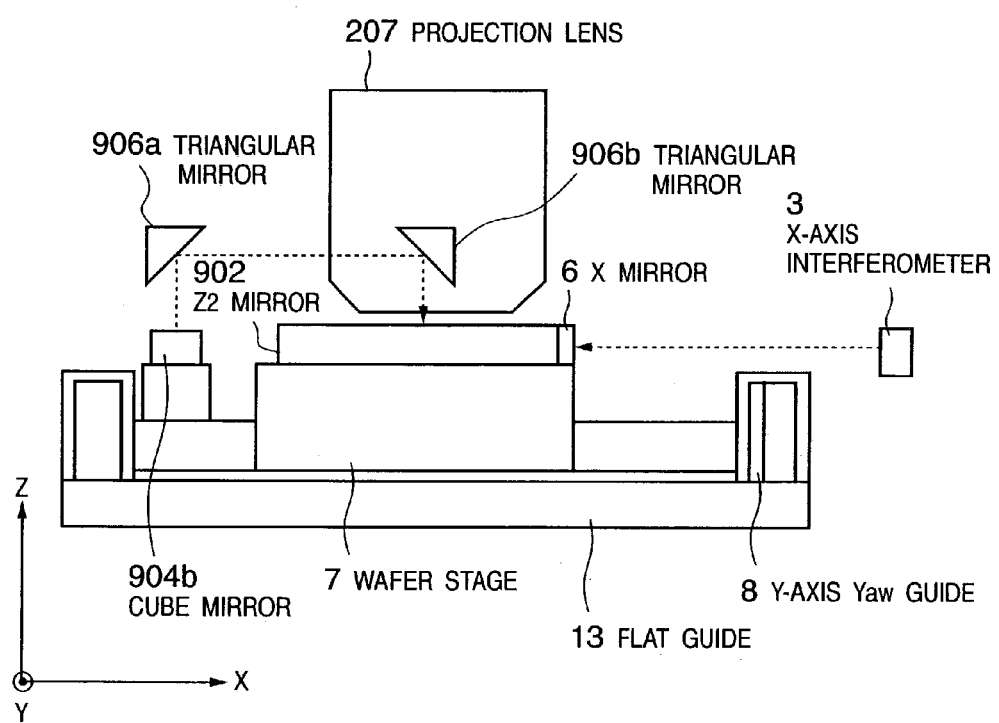
FIG. 10 is a view of the alignment apparatus shown in FIG. 9, as seen from the side.

FIG. 10 is a view of the alignment apparatus shown in FIG. 9, as seen from the side. The Z-axis interferometer measurement light beams reflected by the cube mirrors 904a and 904b in the Z-axis direction are deflected in a direction perpendicular to the incident direction by triangular mirrors 906a and 906b to reach the YZ1 mirror 901 and Z2 mirror 902. The triangular mirrors 906a and 906b are arranged at fixed positions with respect to a projection lens 207, and a spot position illuminated with measurement light moves in the Y-axis direction by the Y-direction driving of the wafer stage 7. A triangular mirror 906b is also arranged symmetrically with the projection lens 207 in the Y-axis direction and deflects interferometer measurement light for measuring the YZ1 mirror 901. In this embodiment, the projection lens 207 needs to be arranged near the center of the stage driving stroke. When a laser interferometer attempts to perform measurement along the Z-axis, the measurement optical axis of the laser interferometer which performs the Z-axis measurement using the projection lens 207 is blocked by the projection lens 207. Accordingly, interferometer switching must be performed within the driving stroke of the wafer stage 7. A method of switching between interferometers while the wafer stage 7 is in a stationary state has been proposed. This method stops the wafer stage 7 over and over during exposure and alignment sequences, thereby decreasing the throughput of the apparatus. According to this embodiment, measurement axis switching of Z-axis interferometers can be performed during driving of the wafer stage 7, and thus a reduction in throughput caused by the stationary switching of interferometers can be avoided.

Figure 11:
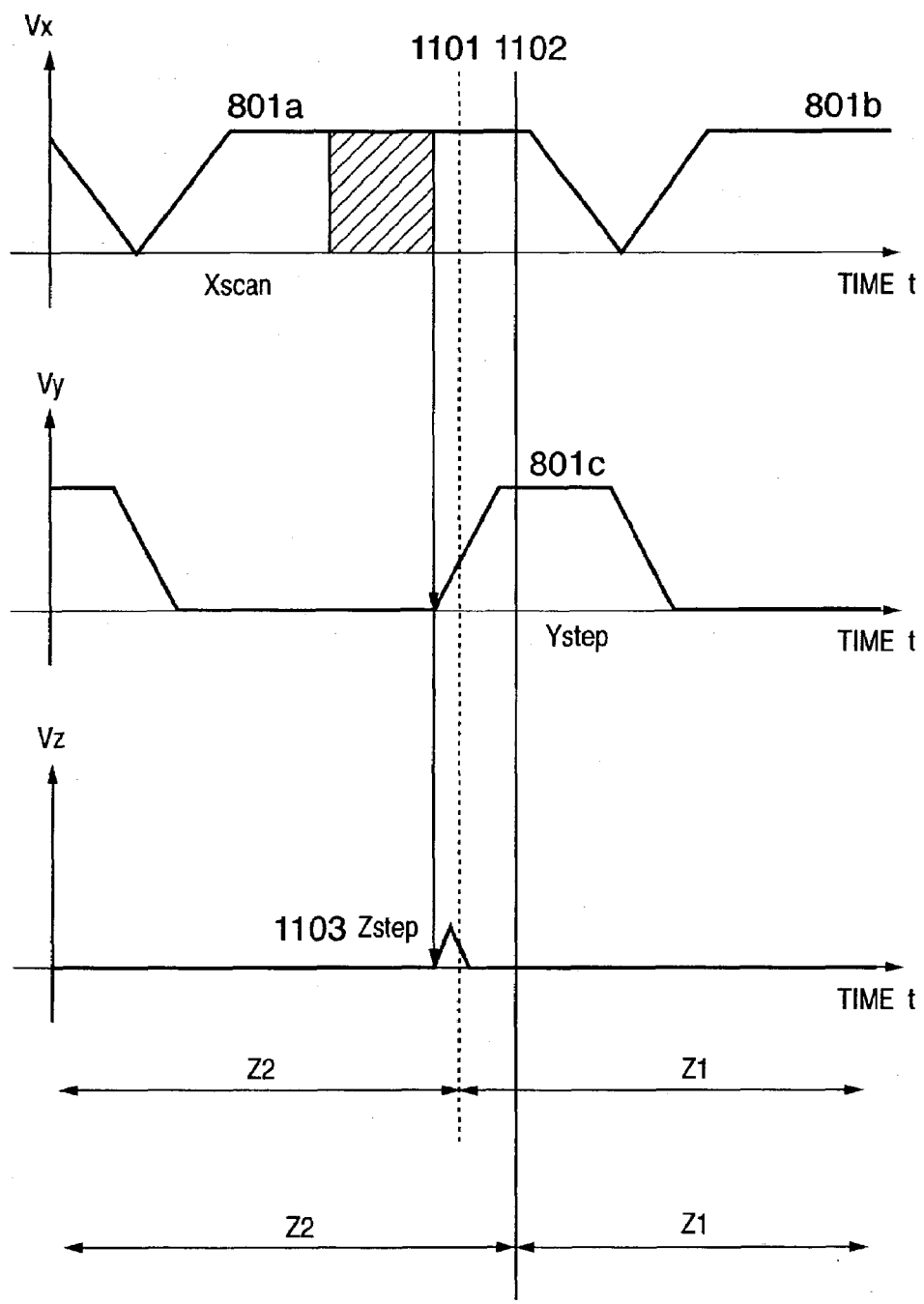
FIG. 11 shows timing charts of the stage driving velocity of the alignment apparatus of FIG. 9.

FIG. 11 shows timing charts of the stage driving velocity of the alignment apparatus shown in FIG. 9. When an exposure slit passes through an exposure zone corresponding to a hatched portion during a scan 801a in the X direction, stepping in the Y direction (Ystep) and Z direction (Zstep) is started immediately. Assume that Ystep (801c) extends across an interferometer switching position 1101. In this case, a measurement value along the Z-axis is obtained by an interferometer Z2 in a region on the left side of the interferometer switching position 1101 and is obtained by an interferometer Z1 in a region on the right side of the interferometer switching position 1101.

In the time charts shown in FIG. 11, interferometer switching is performed during deceleration along the Z-axis. When a measurement value switching method using the interferometers described with reference to FIG. 4 is to be employed, the magnitude of an error which may occur in handover of measurement values increases. For this reason, in the case of this arrangement, the interferometer switching position is changed to a position 1102 to stop the driving along the Z-axis. At the same time, the interferometer measurement axis is switched from Z2 to Z1 at a timing at which Y-axis driving is being performed at a uniform velocity. A position at which Ystep (801c) starts and the stroke vary depending on the shot layout of a wafer to be processed. Hence, the optimum interferometer switching position is desirably changed to a value determined in consideration of the above-mentioned points of view in accordance with the step direction, step target value, and timing of stepping along the Z-axis. Since the driving distance along the Z-axis is generally short in an exposure apparatus, stepping along the Z-axis terminates in a short time. Accordingly, if Z interferometer measurement axes need to be switched in Y-stepping to the next shot (801c), interferometer switching may be performed a predetermined delay period of time after the end of an exposure zone in 801a.

Figure 12:
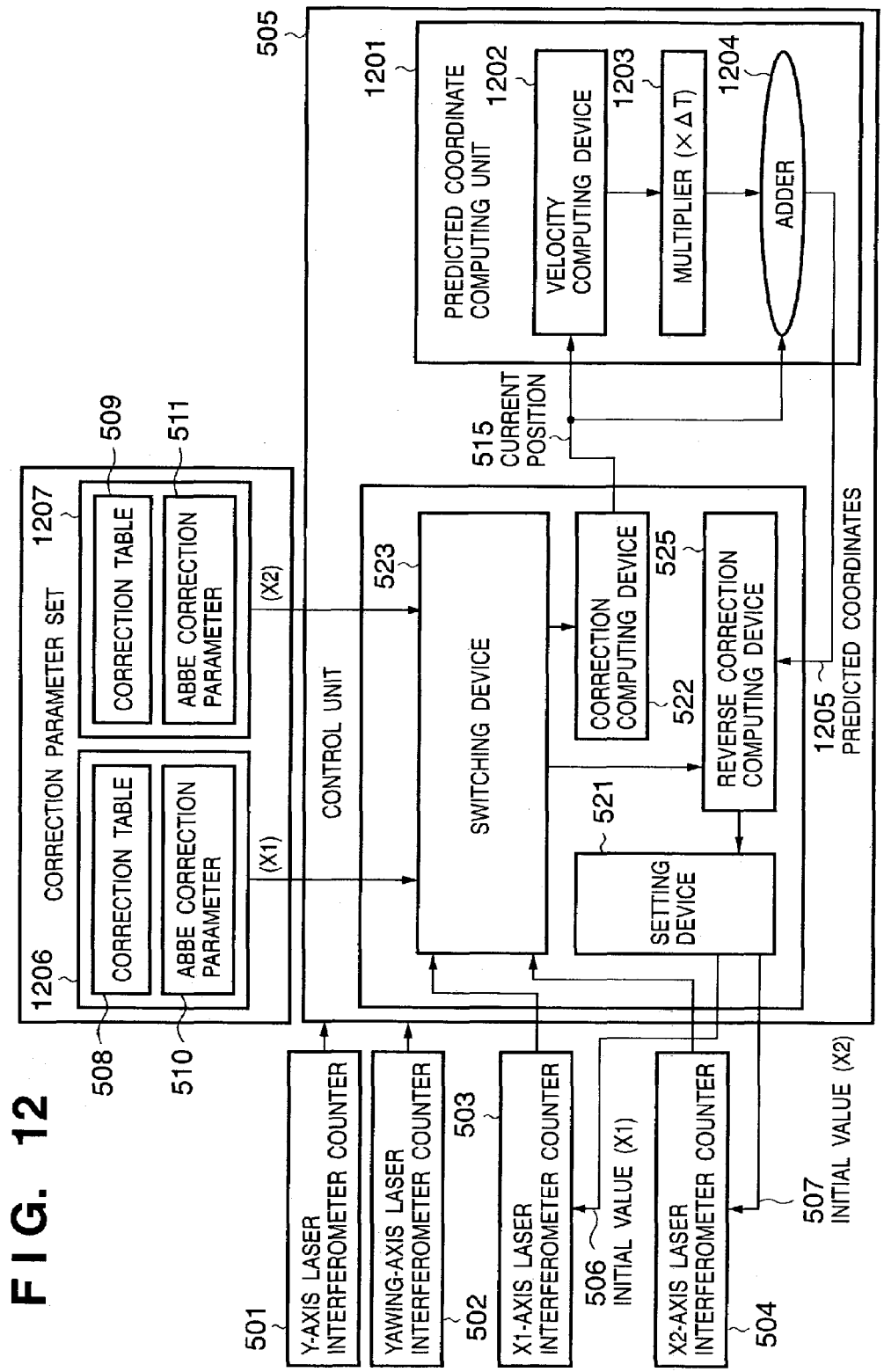
FIG. 12 is a diagram showing the arrangement of a control unit according to the preferred embodiment of the present invention.

FIG. 12 is a diagram showing the arrangement of a control unit 505 according to the preferred embodiment of the present invention. A correction computing device 522, a reverse correction computing device 525, a velocity computing device 1202, a multiplier 1203, and an adder 1204 perform calculations for every control clock, similar to the control compensator 517, profiler 512, and the like1 in FIG. 5. The correction computing device 522 obtains a measurement value for every control clock from one of the Y-axis laser interferometer counter 501, yawing-axis laser interferometer counter 502, X1-axis laser interferometer counter 503, and X2-axis laser interferometer counter 504, which is selected by the switching device 523. The correction computing device 522 performs correction calculation for the measurement value from the selected interferometer using the correction calculation equations (1) to (3) and a correction parameter set such as the correction table of FIGS. 13 or 14 to obtain a current position 515. A predicted coordinate computing unit 1201 causes a velocity computing device 1202 to sequentially perform differentiation calculations for the current position 515 calculated by the correction computing device 522, thereby obtaining a velocity along each axis of each abstract coordinate system for every control clock. The velocity obtained by differentiation is multiplied by a sampling clock (ΔT) using the multiplier 1203, and the current position 515 is added to the velocity by the adder 1204, thereby calculating predicted coordinates 1205 to which the stage is supposed to move until the next control clock. The velocity along each axis of each abstract coordinate system for every control clock may be calculated on the basis of a control target value 514 supplied from the profiler 512 of FIG. 5. Addition of a distance by which the wafer stage 7 moves from the current position 515 until the next control clock to the current position 515 results in the predicted coordinates 1205 in an abstract coordinate system. The wafer stage 7 reaches the predicted coordinates 1205 at the occurrence of the next control clock pulse. The predicted coordinates 1205 are converted by the reverse correction computing device 525 into a preset value (the initial value of a measurement value) corresponding to the interferometer measurement value of each of the laser interferometers between which the switching device 523 performs switching. The reverse correction computing device 525 performs this calculation using a correction parameter set. For example, a calculation may be performed on the basis of the inverse functions of functions used for correction calculation by the correction computing device 522. The preset values for the X1 and X2 laser interferometers obtained by the reverse correction computing device 525 are held in a buffer (not shown) while they are updated for every control clock. Upon receipt of a preset instruction from the control unit 505, each preset value is reflected in the count of the X1-axis laser interferometer counter 503 or X2-axis laser interferometer counter 504.

In this embodiment having this arrangement, a laser interferometer as the switching destination hands over, as the measurement value of a laser interferometer as the switching source, a value obtained by performing inverse operation using the current position 515 and the predicted coordinates 1205 calculated for every control clock. As a result, even if the measurement value is converted again into a value in an abstract coordinate system and read, a profile with respect to a target value in the abstract coordinate system before switching varies smoothly, thereby attaining continuous movement.

Even if correction parameter sets are updated by device readjustment, the continuity of the current position can be maintained, and there is no need to adjust the correction parameter sets. More specifically, to perform precise stage control, stationary fine correction is generally performed in order to improve the dynamic characteristics and obtain the current position in an abstract coordinate system. A more precise system with a high degree of flexibility in design can be constructed by providing correction parameter sets equal in number to interferometer measurement axes in a control system with a function of performing position measurement using a plurality of interferometers per one axis. In passing a measurement value from one of the plurality of interferometers to another, the measurement value of an interferometer as the switching destination is preset to an interferometer preset value obtained by performing fine correction calculation for the target position track of the stage, thereby ensuring the continuity of the current position of the stage in an abstract coordinate system. For a correction parameter set for the measurement optical axis of each laser interferometer, assume that the calculation results of fine correction calculation become discontinuous in the vicinity of the border of a switching position. If a difference between the calculation results is added to interferometer preset data as an offset, handover is performed such that the calculation results become continuous. Consequently, a deviation amount does not change stepwise in interferometer switching, and stable operation of the control system can be ensured.

This embodiment has described a method of presetting the value of a laser interferometer counter to a value in interferometer switching such that the current position in an abstract coordinate system becomes continuous. As an alternative to obtain the same effect, there is available a method of calculating a discontinuous amount in an abstract coordinate system generated in interferometer switching from the measurement value of an interferometer as the switching destination, the correction parameter set, and the control target value 514 generated by the profiler 512 without the presetting of the measurement value of a laser interferometer counter and adding the resultant value to a value obtained by performing fine correction calculation for an interferometer measurement value after switching. Either method is an example of a mechanism for handing over the stage current position in interferometer switching according to the preferred embodiment of the present invention and has as its object to prevent any deviation from the target value of the current position of the wafer stage 7 from changing stepwise.

According to the present invention, for measurement light from a plurality of laser interferometers, if one of correction parameter sets provided for each interferometer measurement optical axis is alternately used in obtaining the current position in an abstract coordinate system, the adjustment standards of a control system can be relaxed, and the flexibility in design can be enhanced. As a result, a more precise and continuous stage alignment system can be provided.

In addition, the moving velocity of the wafer stage is calculated or predicted from the progress of the position measurement data result from an interferometer used before switching, a required period of time from when the current position of the interferometer used before switching is read out to when an interferometer as the switching destination is preset to have a preset data is multiplied by the velocity, and the resultant value is added to the preset data for the interferometer as the switching destination. With this operation, an amount by which the stage moves from when the current position of the interferometer used before switching is read out to when the interferometer as the switching destination is preset to have the preset data can be corrected, and errors which may occur due to interferometer switching during wafer stage driving can be suppressed.

A stepwise command change may occur in a stage driving target value depending on a fine correction amount obtained by fine correction calculation in interferometer switching. In this case, by presetting the current position of an interferometer as the switching destination to a value obtained by subtracting the fine correction amount from the preset value, the continuity of the current position of the wafer stage in an abstract coordinate system can be ensured. As a result, the continuity of a deviation, i.e., a difference between the current position of the wafer stage in the abstract coordinate system and a target position supplied from the profiler can be ensured.

Furthermore, a difference between the current driving target value and the driving target value of the wafer stage in an abstract coordinate system at the occurrence of the next control sample clock pulse or an amount corresponding to the difference is added to a preset value at a timing when an interferometer as the switching destination is preset to have the preset value. With this operation, interferometer switching can be performed during wafer stage driving.

[Embodiment of an Exposure Apparatus]

An embodiment will be explained wherein an alignment apparatus according to the present invention is applied to an exposure apparatus used in the manufacturing process of a semiconductor device.

Figure 15:
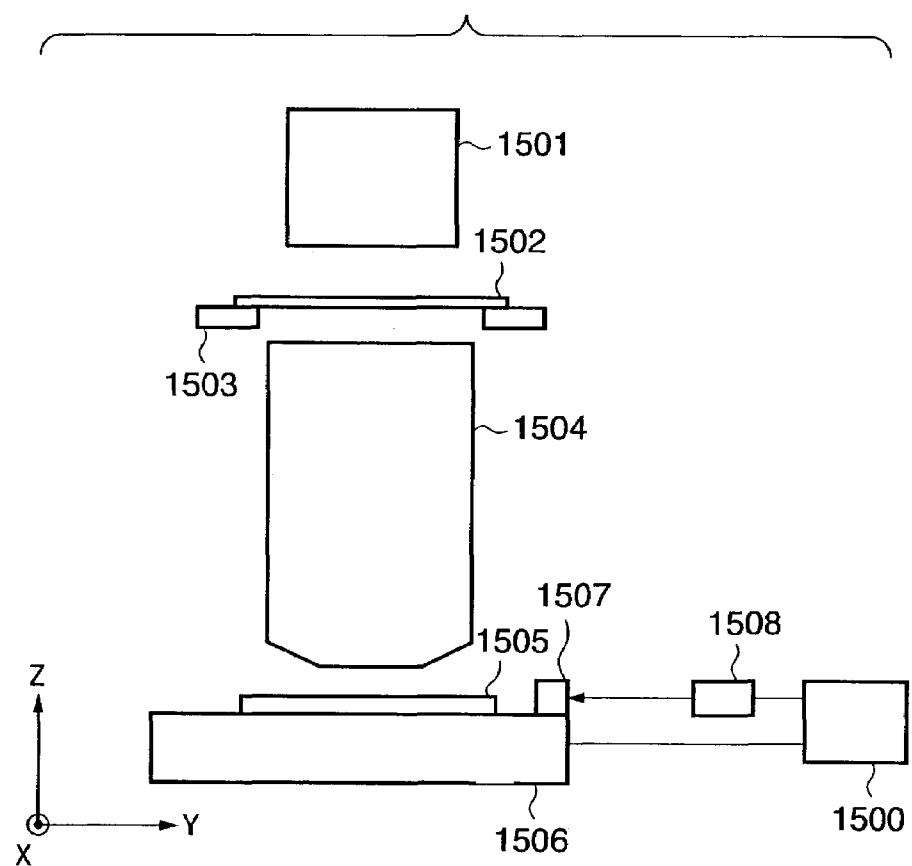
FIG. 15 is a view showing the concept of an exposure apparatus used when an alignment apparatus according to a preferred embodiment of the present invention is applied to a semiconductor device manufacturing process.

FIG. 15 is a view showing the concept of an exposure apparatus used when a stage control apparatus according to a preferred embodiment of the present invention is applied to a semiconductor device manufacturing process. In FIG. 15, light emitted from an illumination optical system 1501 illuminates a reticle 1502 as a master. The reticle 1502 is held on a reticle stage 1503, and the pattern of the reticle 1502 is reduced and projected at the magnification of a reduction projection lens 1504 to form a reticle pattern image on the image plane of the reduction projection lens 1504. The image plane of the reduction projection lens 1504 is perpendicular to the Z direction. The surface of a substrate 1505 as a sample to be exposed is coated with a resist, and shots formed in the exposure step are arranged. The substrate 1505 is mounted on a substrate stage 1506. The substrate stage 1506 comprises a chuck which secures the substrate 1505, an X-Y stage capable of moving horizontally in the X- and Y-axis directions, and the like. The position information of the substrate stage 1506 with respect to a mirror 1507 fixed on the substrate stage 1506 is constantly measured by a substrate stage interferometer 1508. An alignment apparatus 1500 according to a preferred embodiment of the present invention generates a control signal on the basis of a position signal output from the substrate stage interferometer 1508 to control the position of the substrate stage 1506.

<Embodiment of a Semiconductor Production System>

A production system for producing a semiconductor device (e.g., a semiconductor chip such as an IC or LSI, a liquid crystal panel, a CCD, a thin-film magnetic head, a micromachine, or the like) using the above-mentioned exposure apparatus will be exemplified. The system performs maintenance services such as trouble-shooting, periodic maintenance, and software distribution for manufacturing apparatuses installed in a semiconductor manufacturing factory by utilizing a computer network outside the manufacturing factory.

Figure 16:
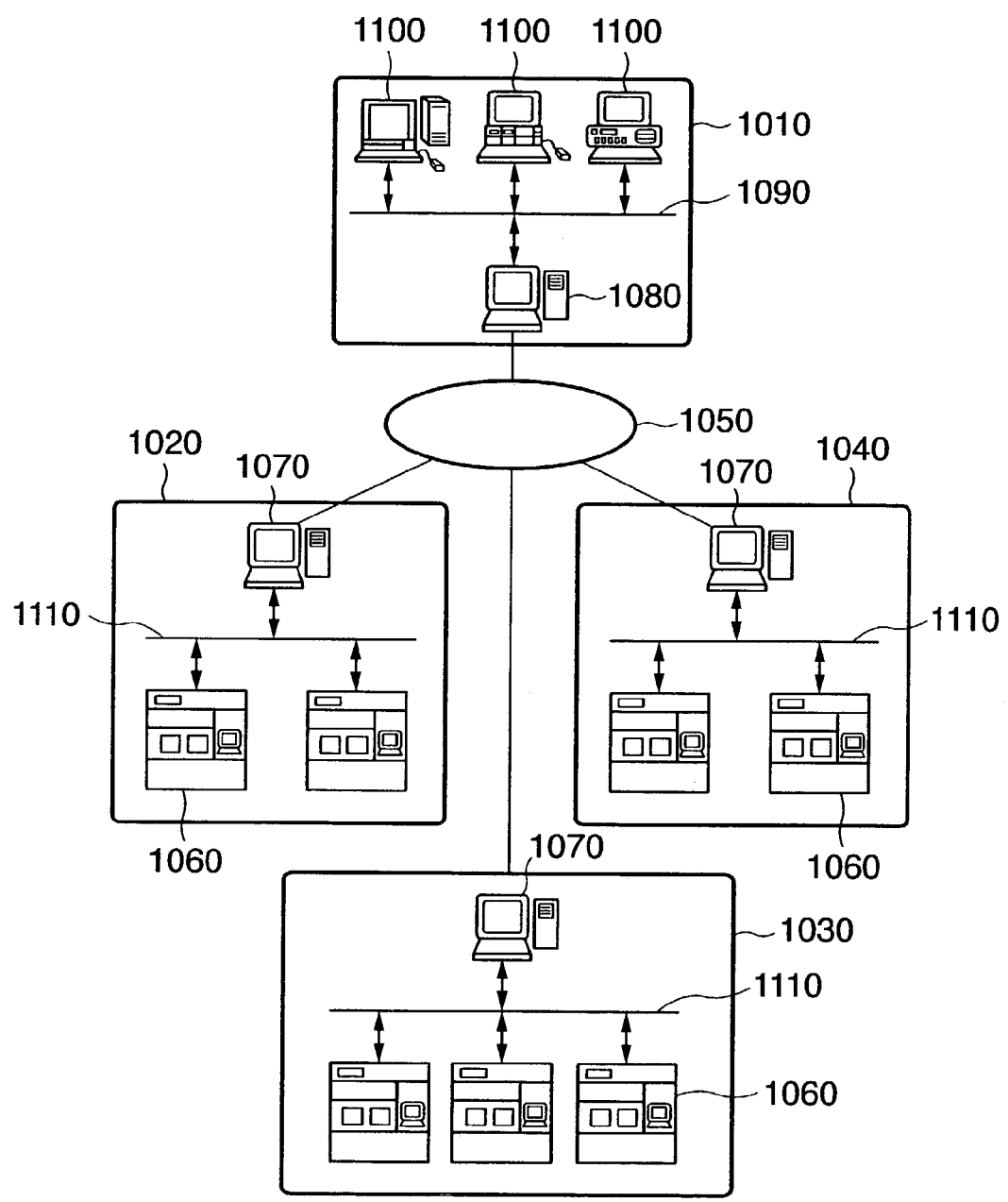
FIG. 16 is a view showing the overall system according to a preferred embodiment of the present invention that is cut out at a given angle.

FIG. 16 is a view showing the overall system according to a preferred embodiment of the present invention that is cut out at a given angle. In FIG. 16, reference numeral 1010 denotes an office of a vendor (e.g., an apparatus supply manufacturer) which provides a semiconductor device manufacturing apparatus. Examples of the manufacturing apparatus are semiconductor manufacturing apparatuses for performing various processes used in a semiconductor manufacturing factory, such as pre-process apparatuses (e.g., lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The office 1010 comprises a host management system 1080, which provides a maintenance database for the manufacturing apparatus, a plurality of operation terminal computers 1100, and a LAN (Local Area Network) 1090, which connects the host management system 1080 and computers 1100 to build an intranet. The host management system 1080 has a gateway for connecting the LAN 1090 to the Internet 1050 serving as an external network of the office, and a security function for limiting external access.

Reference numerals 1020 to 1040 denote manufacturing factories of the semiconductor manufacturer as users of manufacturing apparatuses. The manufacturing factories 1020 to 1040 may belong to different manufacturers or the same manufacturer (pre-process factory, post-process factory, and the like). Each of the factories 1020 to 1040 is equipped with a plurality of manufacturing apparatuses 1060, a LAN (Local Area Network) 1110 which connects these apparatuses 1060 to construct an intranet, and a host management system 1070 serving as a monitoring apparatus which monitors the operation status of each manufacturing apparatus 1060. The host management system 1070 in each of the factories 1020 to 1040 has a gateway for connecting the LAN 1110 in the factory to the Internet 1050 serving as an external network of the factory. Each factory can access the host management system 1080 of the vendor 1010 from the LAN 1110 via the Internet 1050. The security function of the host management system 1080 typically permits only a limited user to access the host management system 1080.

In this system, the factory can notify the vendor via the Internet 1050 of status information (e.g., the symptom of a manufacturing apparatus in trouble) representing the operation status of each manufacturing apparatus 1060. Also, the vendor can transmit, to the factory, response information (e.g., information designating a remedy against the trouble, or remedy software or data) corresponding to the notification, or maintenance information such as the latest software or help information. Data communication between the factories 1020 to 1040 and the vendor 1010 and data communication via the LAN 1110 in each factory typically adopt a communication protocol (TCP/IP) generally used in the Internet. Instead of using the Internet as an external network of the factory, a high-security dedicated network (e.g., ISDN) which inhibits access of a third party can be adopted. The host management system is not limited to the one provided by the vendor. The user may construct a database and set the database on an external network, and the host management system may authorize access to the database from a plurality of user factories.

Figure 17:
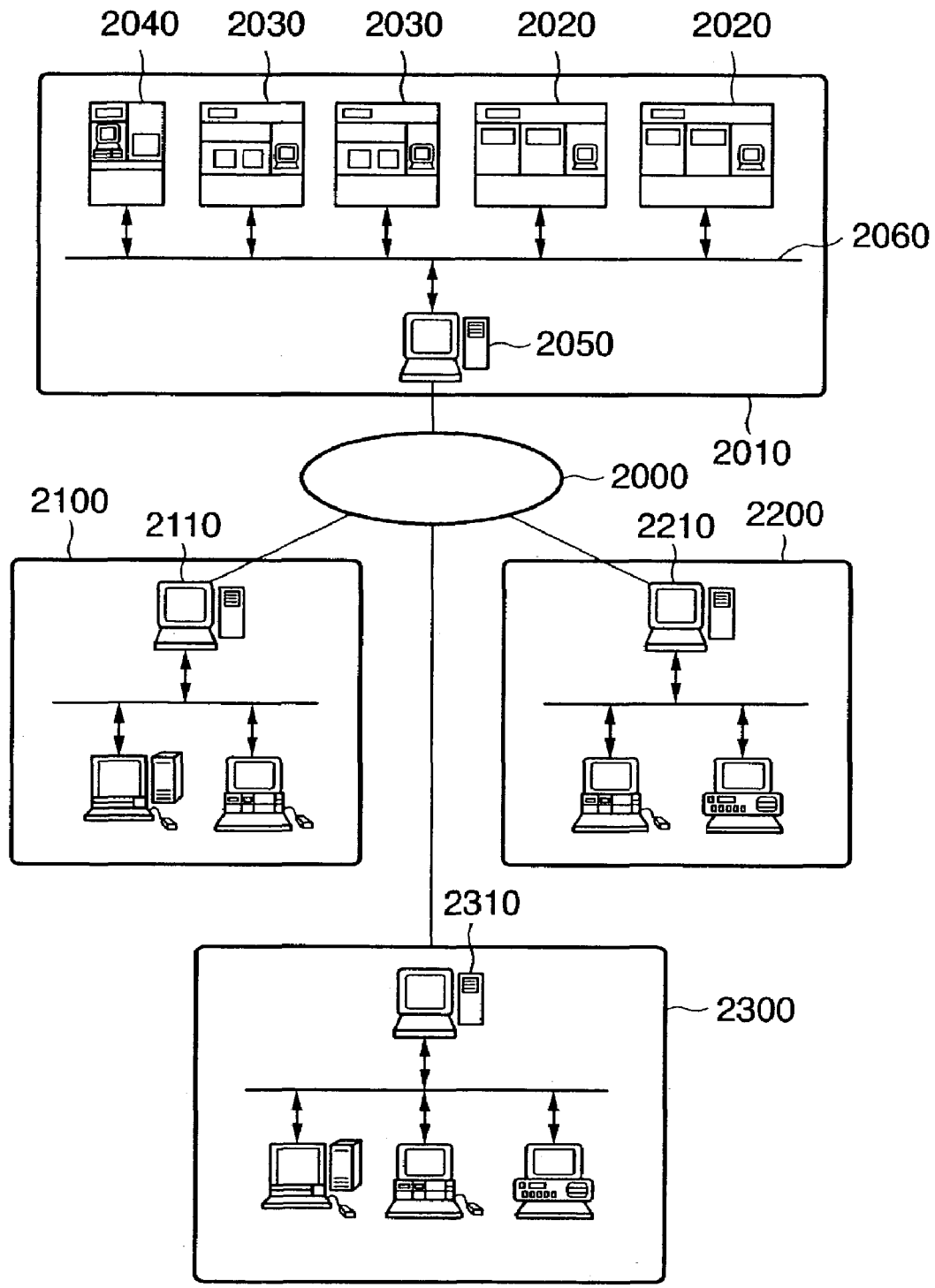
FIG. 17 is a view showing the concept of the overall system of the preferred embodiment of the present invention that is cut out at a different angle from FIG. 16.

FIG. 17 is a view showing the concept of the overall system according to the preferred embodiment of the present invention that is cut out at a different angle from FIG. 16. In the above example, a plurality of user factories having manufacturing apparatuses and the management system of the manufacturing apparatus vendor are connected via an external network, and production management of each factory or information about at least one manufacturing apparatus is communicated via the external network. In the example of FIG. 17, a factory having a plurality of manufacturing apparatuses provided by a plurality of vendors and the management systems of the vendors for these manufacturing apparatuses are connected via the external network of the factory, and maintenance information about each manufacturing apparatus is communicated. In FIG. 17, reference numeral 2010 denotes a manufacturing factory of a manufacturing apparatus user (e.g., a semiconductor device manufacturer). Manufacturing apparatuses for performing various processes, e.g., an exposure apparatus 2020, a resist processing apparatus 2030, and a film formation apparatus 2040 are installed in the manufacturing line of the factory. FIG. 17 shows only one manufacturing factory 2010, but a plurality of factories are networked in practice. The respective apparatuses in the factory are connected to each other by a LAN 2060 to build an intranet, and a host management system 2050 manages the operation of the manufacturing line. The offices of vendors (e.g., apparatus supply manufacturers), such as an exposure apparatus manufacturer 2100, a resist processing apparatus manufacturer 2200, and a film formation apparatus manufacturer 2300 comprise host management systems 2110, 2210, and 2310 for executing remote maintenance for the supplied apparatuses. Each host management system has a maintenance database and a gateway for an external network, as described above. The host management system 2050, which manages the apparatuses in the manufacturing factory of the user, and the management systems 2110, 2210, and 2310 of the vendors for the respective apparatuses are connected via the Internet or dedicated network serving as an external network 2000. In this system, if trouble occurs in any one of the manufacturing apparatuses along the manufacturing line, the operation of the manufacturing line stops. This trouble can be quickly solved by remote maintenance from the vendor of the apparatus in trouble via the Internet 2000. This can minimize the stoppage of the manufacturing line.

Each manufacturing apparatus in the semiconductor manufacturing factory comprises a display, a network interface, and a computer which executes network access software and apparatus operating software that are stored in a storage device. The storage device is a built-in memory, a hard disk, or a network file server. The network access software includes a dedicated or general-purpose web browser, and provides a user interface with a window as shown in FIG. 18 on the display. While referring to this window, the operator who manages manufacturing apparatuses in each factory inputs, into input fields on the windows, pieces of information, such as the model of manufacturing apparatus (4010), serial number (4020), subject of trouble (4030), date of occurrence of trouble (4040), degree of urgency (4050), symptom (4060), remedy (4070), and progress (4080). The pieces of input information are transmitted to the maintenance database via the Internet, and appropriate maintenance information is sent back from the maintenance database and provided on the display. The user interface provided by the web browser realizes hyperlink functions (4100 to 4120), as shown in FIG. 18. This allows the operator to access more detailed information of each item, download the latest-version software to be used for a manufacturing apparatus from a software library provided by a vendor, and download an operation guide (help information) as a reference for the operator in the factory.

A semiconductor device manufacturing process using the production system will be explained. FIG. 19 shows the flow of the whole manufacturing process of a semiconductor device. In step 1 (circuit design), a semiconductor device circuit is designed. In step 2 (exposure control data creation), exposure control data for an exposure apparatus is created on the basis of the designed circuit pattern. In step 3 (wafer formation), a wafer is formed using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7). For example, the pre-process and the post-process may be performed in separate dedicated factories. In this case, each of the factories receives maintenance by the above-mentioned remote maintenance system. Information for production management and apparatus maintenance is communicated between the pre-process factory and the post-process factory via the Internet or dedicated network.

FIG. 20 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), a circuit pattern is drawn (exposed) onto the wafer by the above-mentioned exposure apparatus. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The semiconductor device productivity can be increased in comparison with the prior art.

According to the preferred embodiment of the present invention, position measurement can be performed at high precision by switching between a plurality of position measuring devices.

As many apparently widely different embodiments of the present invention can be made without departing from the spirit and scope thereof, it is to be understood that the invention is not limited to the specific embodiments thereof except as defined in the claims.

What is claimed is:

1. An alignment apparatus comprising:
    a first position measuring device and a second position measuring device which measure position information of an object to be controlled;
    a switching device which switches a position measuring system from said first position measuring device to said second position measuring device, depending on a moving area of the object to be controlled;
    a correction computing device which performs a correction calculation for a measurement result from said first position measuring device using a first correction parameter set to obtain a current position of the object to be controlled;
    a predicted coordinate computing unit which predicts coordinates of the object to be controlled on the basis of progress of a correction calculation result from said correction computing device; and
    a reverse correction computing device which performs a calculation for the coordinates predicted by said predicted coordinate computing unit using a second correction parameter set to obtain a command value for said second position measuring device.

2. The apparatus according to claim 1, wherein said predicted coordinate computing unit includes a velocity computing unit which calculates a velocity of the object to be controlled on the basis of the progress of the correction calculation result from said correction computing device.

3. The apparatus according to claim 2, wherein said predicted coordinate computing unit includes a multiplier which multiplies the velocity of the object to be controlled by a sampling clock time.

4. The apparatus according to claim 3, wherein said predicted coordinate computing unit includes an adder which adds the current position of the object to be controlled calculated by said correction computing device to a product from the multiplier.

5. An exposure apparatus according to claim 1, further comprising:
    an optical system which projects, to a substrate, exposure light incident on a master bearing a pattern;
    a stage apparatus which holds and aligns the substrate or the master; and
    a position controller which generates a signal for driving the object to be controlled to a target position on the basis of a correction calculation result from said correction computing device.

6. A device manufacturing method comprising:
    a step of installing a plurality of semiconductor manufacturing apparatuses, including an exposure apparatus, in a factory; and
    a step of manufacturing a semiconductor device by using the plurality of semiconductor manufacturing apparatuses,
    wherein the exposure apparatus has:
    (a) an optical system which projects, to a substrate, exposure light incident on a master bearing a pattern;
    (b) a stage apparatus which holds and aligns the substrate or the master; and
    (c) an alignment apparatus, according to claim 1, which controls alignment of the stage apparatus,
    wherein the alignment apparatus includes a position controller which generates a signal for driving the object to be controlled to a target position on the basis of a correction calculation result from the correction computing device.

* * * * *

UNITED STATES PATENT AND TRADEMARK OFFICE
CERTIFICATE OF CORRECTION

PATENT NO.       : 7,016,049 B2                                    Page 1 of 1
APPLICATION NO.  : 10/460178
DATED            : March 21, 2006
INVENTOR(S)      : Hiroshi Kurosawa It is certified that error appears in the above-identified patent and that said Letters Patent is hereby corrected as shown below:

COLUMN 3:
　　Line 6, "X1 = L1x(ML1+b)+X0" should read -- X1 = L1x(ML1+1)+X0 --.
　　Line 8, "X2 = L2x(ML2+b)+X0" should read -- X2 = L2x(ML2+1)+X0 --.

COLUMN 10:
　　Line 10, "be" should be deleted.

COLUMN 12:
　　Line 51, "direction;" should read -- directions; --.

COLUMN 16:
　　Line 12, "like1" should read -- like --.

Signed and Sealed this

Fifth Day of September, 2006

JON W. DUDAS
*Director of the United States Patent and Trademark Office*